United States Patent
Goto et al.

(10) Patent No.: US 9,276,603 B2
(45) Date of Patent: Mar. 1, 2016

(54) AD CONVERTER

(71) Applicant: PANASONIC INTELLECTUAL PROPERTY MANAGEMENT CO., LTD., Osaka (JP)

(72) Inventors: Yosuke Goto, Osaka (JP); Michiko Yamada, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/852,440

(22) Filed: Sep. 11, 2015

(65) Prior Publication Data

US 2015/0381200 A1 Dec. 31, 2015

Related U.S. Application Data

(63) Continuation of application No. PCT/JP2013/007655, filed on Dec. 26, 2013.

(30) Foreign Application Priority Data

Mar. 12, 2013 (JP) .................. 2013-049450
Aug. 5, 2013 (JP) .................. 2013-162140

(51) Int. Cl.
    *H03M 3/00*      (2006.01)

(52) U.S. Cl.
    CPC .................. *H03M 3/458* (2013.01)

(58) Field of Classification Search
    CPC ......... H03M 1/12; H03M 1/00; H03M 3/458; H03M 3/30; H03M 2201/20; H03M 2201/11
    USPC ........................ 341/143, 155, 156
See application file for complete search history.

(56) References Cited

U.S. PATENT DOCUMENTS 5,844,514 A    12/1998    Ringh et al.
6,340,945 B1    1/2002    Hauptmann et al.
(Continued)

FOREIGN PATENT DOCUMENTS

JP    10-508167 A    8/1998
JP    2002-532937 A    10/2002
JP    2007-036580 A    2/2007

OTHER PUBLICATIONS

Chen, H. et al., "A 13-bit, Low-Power, Compact ADC Suitable for Sensor Applications," Proceedings of 2010 International Symposium on Circuits and Systems (ISCAS), pp. 2414-2417, 2010.
(Continued)

*Primary Examiner* — Jean B Jeanglaude
(74) *Attorney, Agent, or Firm* — McDermott Will & Emery LLP

(57) ABSTRACT

An AD converter includes a delta-sigma AD converter configured to receive an analog signal through an input terminal and obtain a higher-order bit conversion result, a first cyclic AD converter configured to receive a residual signal resulting from removal of a higher-order bit or bits, and performs a conversion process having a amplification factor of one to obtain a 1.5-bit conversion result, a second cyclic AD converter configured to perform a conversion process having an amplification factor of two to obtain a lower-order bit conversion result, and a shift register and a digital accumulator circuit that are configured to receive a higher-order bit, a 1.5-bit, and a lower-order bit conversion result and output an AD conversion value.

15 Claims, 16 Drawing Sheets

(56) References Cited

U.S. PATENT DOCUMENTS

| | | | |
|---|---|---|---|
| 2009/0031195 A1* | 1/2009 | Tiong | H03M 13/136 714/781 |
| 2009/0033534 A1* | 2/2009 | Kobayashi | H03M 1/0607 341/150 |

OTHER PUBLICATIONS

International Search Report and Written Opinion issued in corresponding International Patent Application No. PCT/JP2013/007655, mailed on Apr. 8, 2014; 6 pages with partial English translation.

* cited by examiner

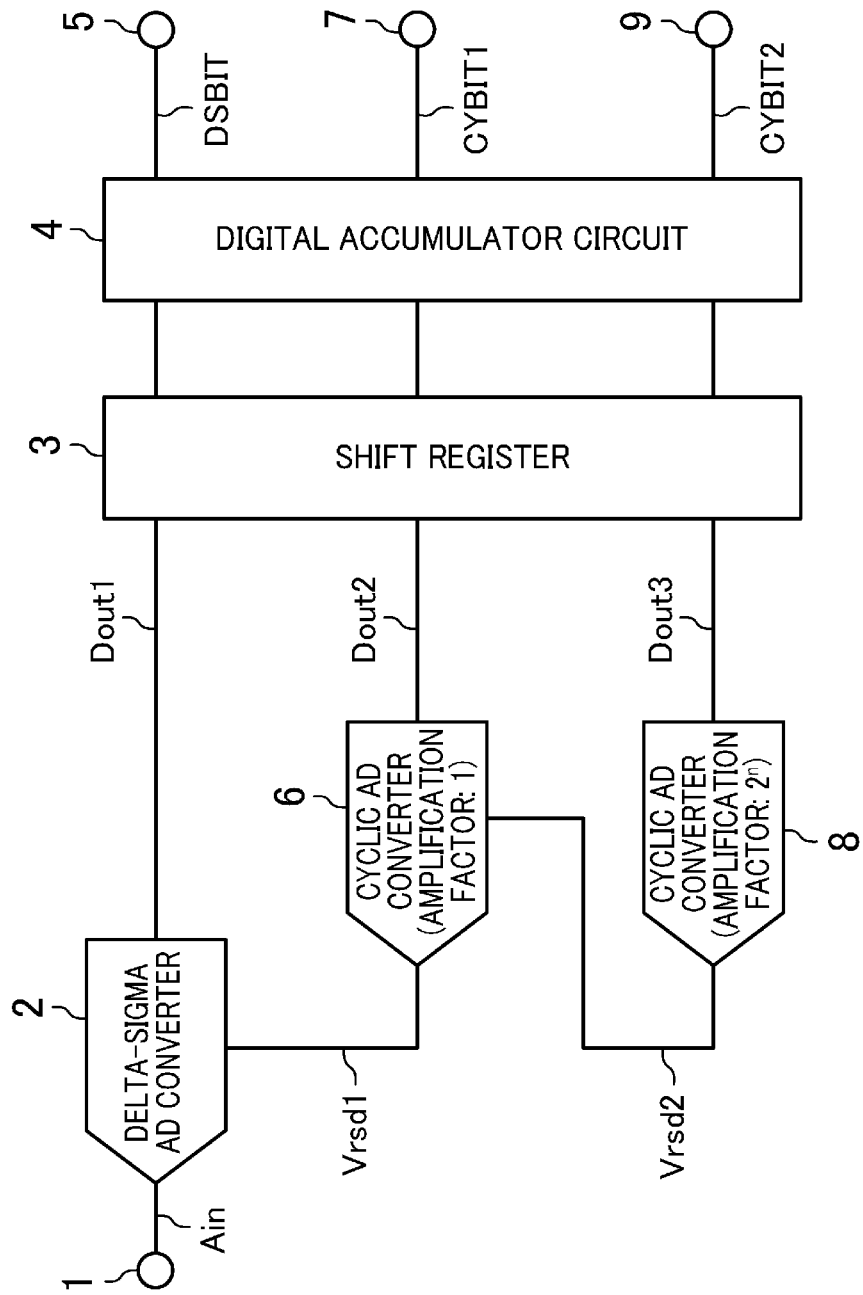

FIG.4A

HIGHER-ORDER BITS | 0 0 | 0 1 | 1 0 | 1 1

FIG.4B

RESIDUAL VOLTAGE

+Vref

−Vref

INPUT VOLTAGE

FIG.4C

OUTPUT CODE OF CYCLIC CONVERSION

MSB
LSB
MSB
LSB
MSB
LSB

FIG.4D

OUTPUT CODE

4 BITS
5 BITS

INPUT VOLTAGE

FIG.16A
PRIOR ART

HIGHER-ORDER BITS: 0 0 | 0 1 | 1 0 | 1 1

FIG.16B
PRIOR ART

RESIDUAL VOLTAGE
+Vref
−Vref
INPUT VOLTAGE

FIG.16C
PRIOR ART

OUTPUT CODE OF CYCLIC CONVERSION

LSB ... MSB
LSB ... MSB
LSB ... MSB
LSB ... MSB

FIG.16D
PRIOR ART

OUTPUT CODE

4 BITS

INPUT VOLTAGE

AD CONVERTER

CROSS-REFERENCE TO RELATED APPLICATIONS

This is a continuation of International Application No. PCT/JP2013/007655 filed on Dec. 26, 2013, which claims priority to Japanese Patent Application No. 2013-049450 filed on Mar. 12, 2013 and Japanese Patent Application No. 2013-162140 filed on Aug. 5, 2013. The entire disclosures of these applications are incorporated by reference herein.

BACKGROUND

The present disclosure relates to an analog-to-digital (AD) converter having improved differential nonlinearity (DNL).

There has in recent years been a demand for the size reduction of multifunctional mobile terminals for easier portability. To meet the demand, it is necessary to further reduce the sizes of an integrated circuit and a sensor device included in a multifunctional terminal. In particular, when an integrated circuit includes an AD converter that converts an output signal of a sensor device into a digital signal, it is necessary to reduce the area of the AD converter, which uses a large area of the integrated circuit.

On the other hand, the size reduction of a sensor device has led to a reduction in the detection sensitivity of the sensor device, i.e., a reduction in output signal level. To compensate for such a sensitivity reduction, the AD converter has been required to have higher accuracy.

Under such circumstances, a technique has been developed that utilizes a combination of different AD converters to extract higher-order bits and lower-order bits (see Japanese Unexamined Patent Publication (Japanese Translation of PCT Application) No. H10-508167, and H. Chen et al., "A 13-bit, Low-Power, Compact ADC Suitable for Sensor Applications," Proceedings of 2010 International Symposium on Circuits and Systems (ISCAS), pp. 2414-2417, 2010) However, in such a conventional AD converter, the linearity of the output signal with respect to the input signal deteriorates in some cases.

FIGS. 16A, 16B, 16C, and 16D are diagrams showing an output waveform of a conventional lower-order bit AD converter. As shown in these figures, a missing code occurs at a boundary point of the higher-order bits output by the delta-sigma AD converter. A missing code refers to a phenomenon that a portion of a digital code corresponding to an analog input is not output. Specifically, if differential nonlinearity is greater than or equal to ±1 LSB based on the least significant bit (LSB: the lowest-order bit), an output code is missing.

As described above, AD converters are required to be free from a missing code. However, in the conventional art, it is difficult to reduce or prevent the occurrence of a missing code.

SUMMARY

The present disclosure describes implementations of an AD converter having improved output signal linearity.

An example AD converter of the present disclosure includes 1) a first AD converter including an analog accumulator circuit, an AD converter, and a digital-to-analog (DA) converter, and configured to receive an analog signal and obtain a first conversion result having a higher-order bit or bits, 2) a second AD converter including an analog accumulator circuit, an AD converter, and a DA converter, and configured to receive a residual signal resulting from removal of the higher-order bit or bits, and perform a first conversion process and a second conversion process to obtain a second conversion result having a lower-order bit or bits, and 3) a calculation unit configured to calculate and output an AD conversion value of the analog signal based on the first and second conversion results, and in which 4) the analog accumulator circuit in the first conversion process and the analog accumulator circuit in the second conversion process use different gains.

Another example AD converter of the present disclosure includes 1) a first AD converter including a loop of a) an input terminal configured to receive an analog signal, b) a first analog accumulator circuit having a first gain, c) a first bit data AD converter configured to output bit data having a first value, d) a DA converter, and e) a difference circuit configured to output a difference signal between a signal of the input terminal and an output signal of the DA converter, and configured to receive the analog signal and obtain a first conversion result having a higher-order bit or bits, and 2) a second AD converter including a loop of a) an input terminal configured to receive an analog signal, b) a second analog accumulator circuit configured to select a first gain and a second gain, c) a second bit data AD converter configured to output bit data having a second value, d) a DA converter, and e) a difference circuit configured to output a difference signal between a signal of the input terminal and an output signal of the DA converter, and configured to cause the second accumulator circuit to receive a difference signal between a signal input to the input terminal, where the signal is a null signal, and a residual signal resulting from removal of the higher-order bit or bits, and perform a first conversion process and a second conversion process to obtain a second conversion result having a lower-order bit or bits, and in which 3) the second analog accumulator circuit uses the first gain in the first conversion process, and the second gain different from the first gain in the second conversion process.

Another example AD converter of the present disclosure includes 1) a first AD converter including a loop of a) at least one input terminal configured to receive an analog signal, b) at least one first analog accumulator circuit having a first gain, c) at least one first bit data AD converter configured to output bit data having a first value, d) at least one DA converter, and e) at least one difference circuit configured to output a difference signal between a signal of the input terminal and an output signal of the DA converter, and configured to receive the analog signal and obtain a first conversion result having a higher-order bit or bits, and 2) a second AD converter including a loop of a) an input terminal configured to receive an analog signal, b) a second analog accumulator circuit configured to select a third gain and a second gain, c) a second bit data AD converter configured to output bit data having a second value, d) a DA converter, and e) a difference circuit configured to output a difference signal between a signal of the input terminal and an output signal of the DA converter, and configured to cause the second accumulator circuit to receive a difference signal between a signal input to the input terminal, where the signal is a null signal, and a residual signal resulting from removal of the higher-order bit or bits, and perform a first conversion process and a second conversion process to obtain a second conversion result having a lower-order bit or bits, and in which 3) the second analog accumulator circuit uses the third gain in the first conversion process, and the second gain different from the third gain in the second conversion process.

Another example AD converter of the present disclosure includes 1) a first AD converter including a loop of a) an input terminal configured to receive an analog signal, b) a first analog accumulator circuit having a first gain, c) a first bit data AD converter configured to output bit data having a first value, d) a DA converter, and e) a difference circuit configured to output a difference signal between a signal of the input terminal and an output signal of the DA converter, and configured to receive an analog signal and obtain a first conversion result having a higher-order bit or bits, and 2) a second AD converter including a loop of a) the input terminal, b) the DA converter, c) a second analog accumulator circuit sharing the difference circuit, and configured to select gains, and d) a second bit data AD converter configured to output bit data having a second value, and configured to receive a residual signal resulting from removal of the higher-order bit or bits from the analog signal, and perform a first conversion process and a second conversion process to obtain a second conversion result having a lower-order bit or bits, and in which 3) the second analog accumulator circuit performs integration using the first gain in the first conversion process, and performs integration using the second gain different from the first gain in the second conversion process.

The AD converter of the present disclosure effectively performs AD conversion with good linearity while reducing or preventing the occurrence of a missing code.

BRIEF DESCRIPTION OF THE DRAWINGS

FIG. 1 is a diagram showing an AD converter according to a first embodiment of the present disclosure.

FIGS. 4A, 4B, 4C, and 4D are diagrams showing an input voltage and an output code in the AD converter of the first embodiment of the present disclosure.

FIGS. 16A, 16B, 16C, and 16D are diagrams showing output waveforms of a conventional lower-order bit AD converter.

DETAILED DESCRIPTION

Figure 2A:
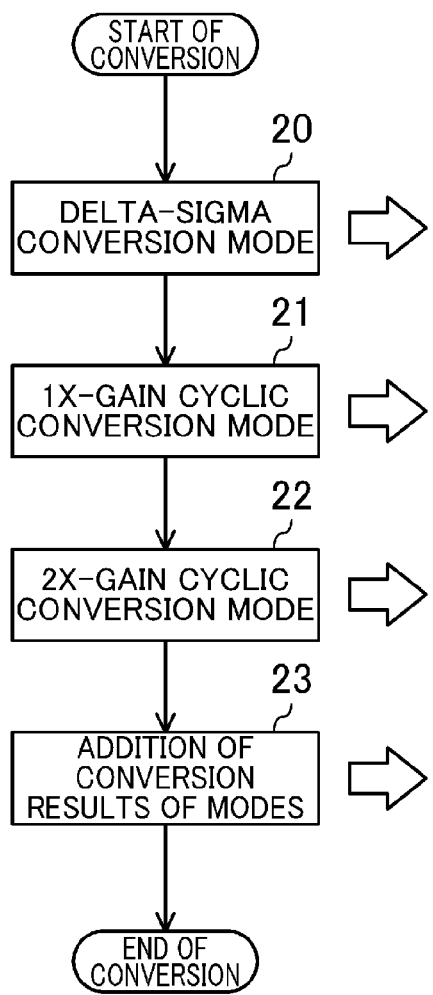
FIG. 2A is a diagram showing a flow of conversion performed by the AD converter of the first embodiment of the present disclosure.

Embodiments of the present disclosure will now be described in detail with reference to the accompanying drawings.

To avoid unnecessarily obscuring the present disclosure, well-known features may not be described or substantially the same elements may not be redundantly described, for example. This is for ease of understanding.

The drawings and the following description are provided to enable those skilled in the art to fully understand the present disclosure and are in no way intended to limit the scope of the present disclosure as set forth in the appended claims.

First Embodiment

FIG. 1 is a diagram showing an AD converter according to a first embodiment of the present disclosure. In FIG. 1, a signal is input to an input terminal 1, and the results of conversion are output to output terminals 5, 7, and 9. While the output terminals 5, 7, and 9 are described as separate terminals, the output terminals 5, 7, and 9 may be implemented by only a single output terminal that outputs different process results after different elapsed times.

An analog input signal Ain to the input terminal 1 is input to a delta-sigma AD converter 2, which then performs a 1-bit delta-sigma AD conversion process. The delta-sigma AD conversion process outputs a quantized signal Dout1 according to a conversion process cycle. The quantized signal Dout1 is input to a shift register 3, which then performs a shift process. The shifted signal is input to a digital accumulator circuit 4, which then outputs a digitally integrated signal as a higher-order bit signal DSBIT to the output terminal 5. Note that when the higher-order bits are set to be two bits, four cycles of delta-sigma AD conversion are performed.

After the higher-order bit signal DSBIT is obtained, the delta-sigma AD converter 2 outputs a residual signal Vrsd1 that is a higher-order bit analog residual signal. The residual signal Vrsd1 is input to a first cyclic AD converter 6, which then performs a 1.5-bit cyclic AD conversion process. The first cyclic AD converter 6 outputs a quantized signal Dout2. At this time, the first cyclic AD converter 6 is set to have an amplification factor of one. The quantized signal Dout2 is input to the shift register 3, which then performs a shift process. The shifted signal is input to the digital accumulator circuit 4, which then outputs an overlap bit signal CYBIT1 of higher-order bits and lower-order bits to the output terminal 7.

Next, the first cyclic AD converter 6 outputs a residual signal Vrsd2 resulting from extraction of the overlap bit signal CYBIT1 to a second cyclic AD converter 8, which then performs a cyclic AD conversion process. At this time, the second cyclic AD converter 8 is set to have an amplification factor of two. The second cyclic AD conversion process outputs a quantized signal Dout3 for each cycle. The quantized signal Dout3 is output to the shift register 3, which then performs a shift process. The shifted signal is input to the digital accumulator circuit 4, which then outputs a lower-order bit signal CYBIT2 to the output terminal 9. Note that when the lower-order bits are set to be four bits, four cycles of second cyclic AD conversion are performed.

Figure 2B:
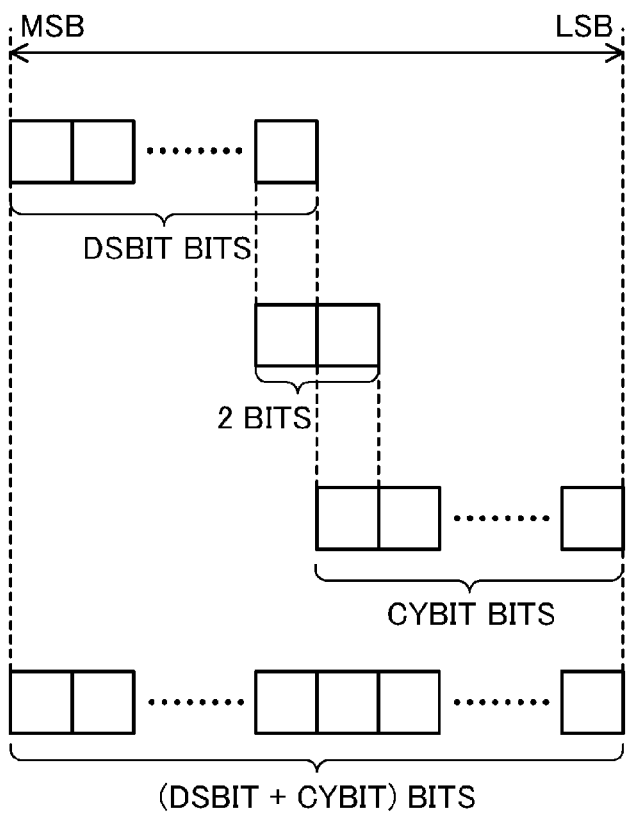
FIG. 2B is a diagram showing the positions of bits in the AD converter of the first embodiment of the present disclosure.

FIG. 2A is a diagram showing a flow of conversion performed by the AD converter according to the first embodiment. FIG. 2B is a diagram showing the positions (depths) of bits of digital data according to the first embodiment.

As shown in FIG. 2A, the AD converter of the present disclosure performs conversion by switching between three operation states (modes). The first mode is a delta-sigma conversion mode 20 in which the AD converter performs delta-sigma AD conversion. The second mode is a 1×-gain cyclic conversion mode 21 in which the AD converter performs cyclic AD conversion with a gain of one. The third mode is a 2×-gain cyclic conversion mode 22 in which the AD converter performs cyclic AD conversion with a gain of two.

As shown in FIG. 2B, in the delta-sigma conversion mode 20, the result of conversion of the higher-order bits can be obtained. When the higher-order bits are DSBIT bits, DSBIT conversion results are put in a bit array from the most significant bit (MSB: the highest-order bit) toward the LSB.

As shown in FIG. 2B, in the 1×-gain cyclic conversion mode 21, the result of 1.5-bit conversion is obtained. Two bits are allocated to this result.

As shown in FIG. 2B, in the 2×-gain cyclic conversion mode 22, the result of conversion of the lower-order bits CYBIT can be obtained.

The digital output signals of conversion results in these modes are added together in an addition step 23, to obtain a final AD conversion result. Note that not all the conversion modes have to be completed before the above addition is performed.

Thus, the 1.5 bits obtained in the 1×-gain cyclic conversion mode 21 overlaps a bit positioned at the lowest order of the higher-order bit signal DSBIT in a direction from the MSB to the LSB and a bit positioned at the highest order of the lower-order bit signal CYBIT output in the 2×-gain cyclic conversion mode 22.

Figure 3A:
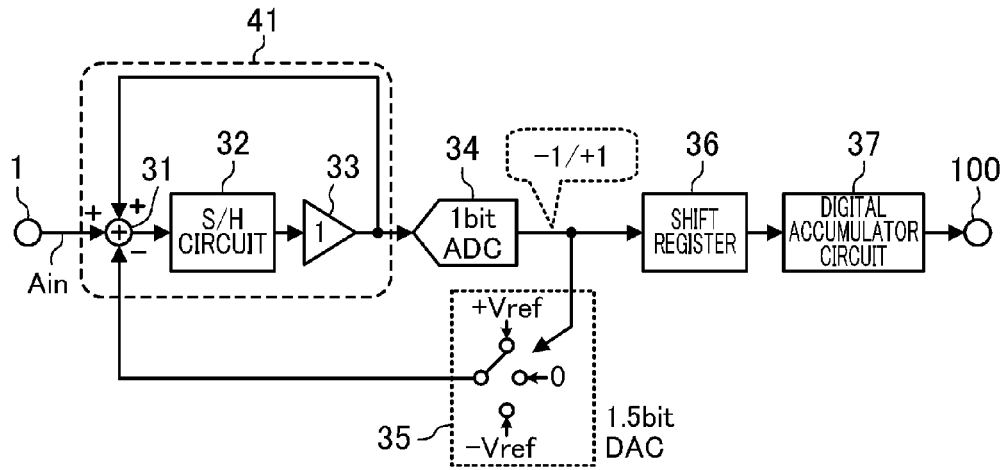
FIGS. 3A, 3B, and 3C are diagrams showing configurations in respective conversion modes of the AD converter of the first embodiment of the present disclosure.
Figure 3B:
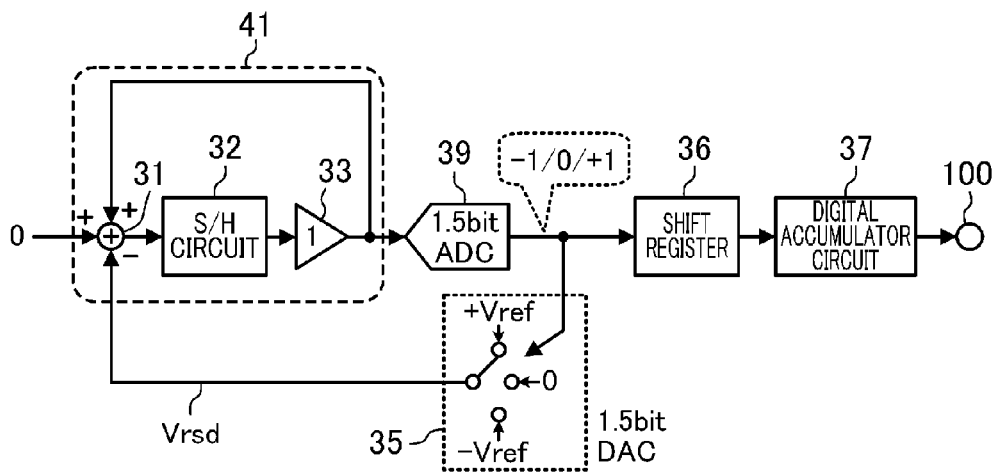
Figure 3C:
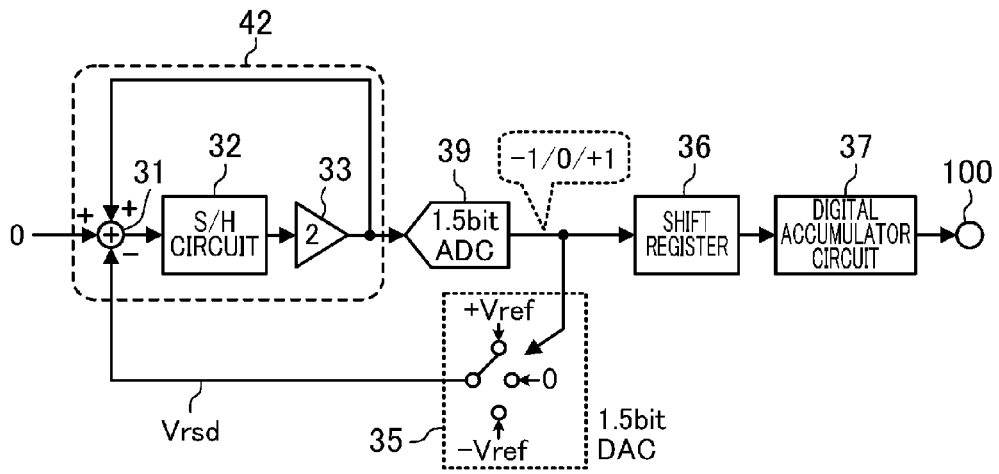

FIG. 3A is a block diagram showing a configuration of the AD converter in the delta-sigma conversion mode. FIG. 3B is a block diagram showing a configuration of the AD converter in the 1×-gain cyclic conversion mode. FIG. 3C is a block diagram showing a configuration of the AD converter in the 2×-gain cyclic conversion mode.

<<Delta-Sigma Conversion Mode>>

In FIG. 3A, the analog signal Ain is input through the input terminal 1 to a subtractor 31. An output signal of the subtractor 31 is held by a sample hold circuit 32. The held signal is input to an amplifier 33, which then amplifies the signal with a gain of one. Note that a signal output from the amplifier 33 is fed back to the subtractor 31, which forms a 1×-gain analog accumulator circuit 41.

The output signal of the amplifier 33 is input to a sub-AD converter 34, which then performs 1-bit AD conversion to output a binary digital signal "+1" or "−1." The digital signal output by the sub-AD converter 34 input to a sub-DA converter 35, which then performs 1-bit DA conversion using reference voltages +Vref and −Vref. An output of the sub-DA converter 35 is input to one terminal of the subtractor 31, which then outputs a difference signal indicating a difference between the output of the sub-DA converter 35 and the analog input signal Ain.

Note that when a signal is input for the first time, the output of the sub-DA converter 35 is reset to zero.

Thus, the subtractor 31, the sample hold circuit 32, the amplifier 33, the sub-AD converter 34, and the sub-DA converter 35 form a closed loop of delta-sigma conversion.

Next, a shift register 36 shifts the digital output signal of the sub-AD converter 34 in a direction from the MSB toward the LSB (hereinafter referred to as "right shift") by (DSBIT−1) in synchronization with an externally input clock signal (not shown). When DSBIT is two bits, the signal is right-shifted toward the LSB by one bit as shown in FIG. 2B.

A digital accumulator circuit 37 accumulates a digital output signal of the shift register 36. Note that digital integration is performed by accumulating, for example, 1-bit digital data that is successively input, and outputting the accumulated data.

In the delta-sigma conversion mode 20, the above operation, which is one cycle, is performed two to the power of DSBIT times to obtain the higher-order bits DSBIT at an output terminal 100.

<<1×-Gain Cyclic Conversion Mode>>

In the 1×-gain cyclic conversion mode of FIG. 3B, the input signal is zero, and therefore, the sample hold circuit 32 holds a difference between the output of the amplifier 33 and the output of the sub-DA converter 35. The held signal is input to the amplifier 33, which then amplifies the signal with a gain of one. Note that the signal output from the amplifier 33 is fed back to the subtractor 31, which forms the 1×-gain analog accumulator circuit 41. A sub-AD converter 39 performs 1.5-bit AD conversion on the analog output signal of the 1×-gain amplifier 33. Moreover, the sub-DA converter 35 performs 1.5-bit DA conversion on the digital output signal of the sub-AD converter 39.

Thus, the subtractor 31, the sample hold circuit 32, the amplifier 33, the sub-AD converter 39, and the sub-DA converter 35 forms a closed loop of the 1×-gain cyclic conversion mode.

As shown in FIG. 2B, the shift register 36 right-shifts the digital output signal of the sub-AD converter 39 by (DSBIT−1). The digital accumulator circuit 37 digitally integrates the digital output signal of the shift register 36.

Thus, accumulation is performed in the same shift amount as that of delta-sigma conversion, and therefore, a conversion result that overlaps the lowest-order bit of delta-sigma conversion is obtained at the output terminal 100. Also, by obtaining such a 1.5-bit result, the initial shift amount in the 2×-gain cyclic conversion mode described next is set to DSBIT, which is greater by one than the shift amount (DSBIT−1) in the 1×-gain cyclic conversion mode, and therefore, the 1×-gain cyclic conversion mode and the 2×-gain cyclic conversion mode can be caused to overlap.

<<2×-Gain Cyclic Conversion Mode>>

In the 2×-gain cyclic conversion mode of FIG. 3C, the sample hold circuit 32 holds a difference between the output of the 2×-gain amplifier 33 and the output of the sub-DA converter 35. The 2×-gain amplifier 33 doubles the analog output signal of the sample hold circuit 32. Note that the signal output from the amplifier 33 is fed back to the subtractor 31, which forms a 2×-gain analog accumulator circuit 42. The sub-AD converter 39 performs 1.5-bit AD conversion on the analog output signal of the 2×-gain amplifier 33.

As shown in FIG. 2B, the shift register 36 right-shifts the digital output signal of the sub-AD converter 39 by a value that is obtained by adding the current cycle count of the 2×-gain cyclic conversion mode to (DSBIT−1).

The digital accumulator circuit 37 digitally integrates the digital output signal of the shift register 36. In the 2×-gain cyclic conversion mode, the above operation, which is one cycle, is performed CYBIT times to obtain the lower-order bits CYBIT at the output terminal 100.

FIG. 4A is a diagram showing the higher-order bits after 2-bit delta-sigma conversion. FIG. 4B is a diagram showing the residual voltage of the integrator after 2-bit delta-sigma conversion. FIG. 4C is a diagram showing a cyclic conversion output code resulting from cyclic conversion of the residual voltage. FIG. 4D shows a relationship between an input voltage and an output code where 2-bit delta-sigma conversion and total 5-bit cyclic conversion (the total of 5 bits includes overlap), i.e., total 6-bit AD conversion, are performed. The overlap of this embodiment allows for conversion without the end codes (MSB and LSB), which are used in conventional cyclic conversion. Therefore, conventional missing codes shown in FIGS. 16A-16D do not occur.

Second Embodiment

Figure 5:
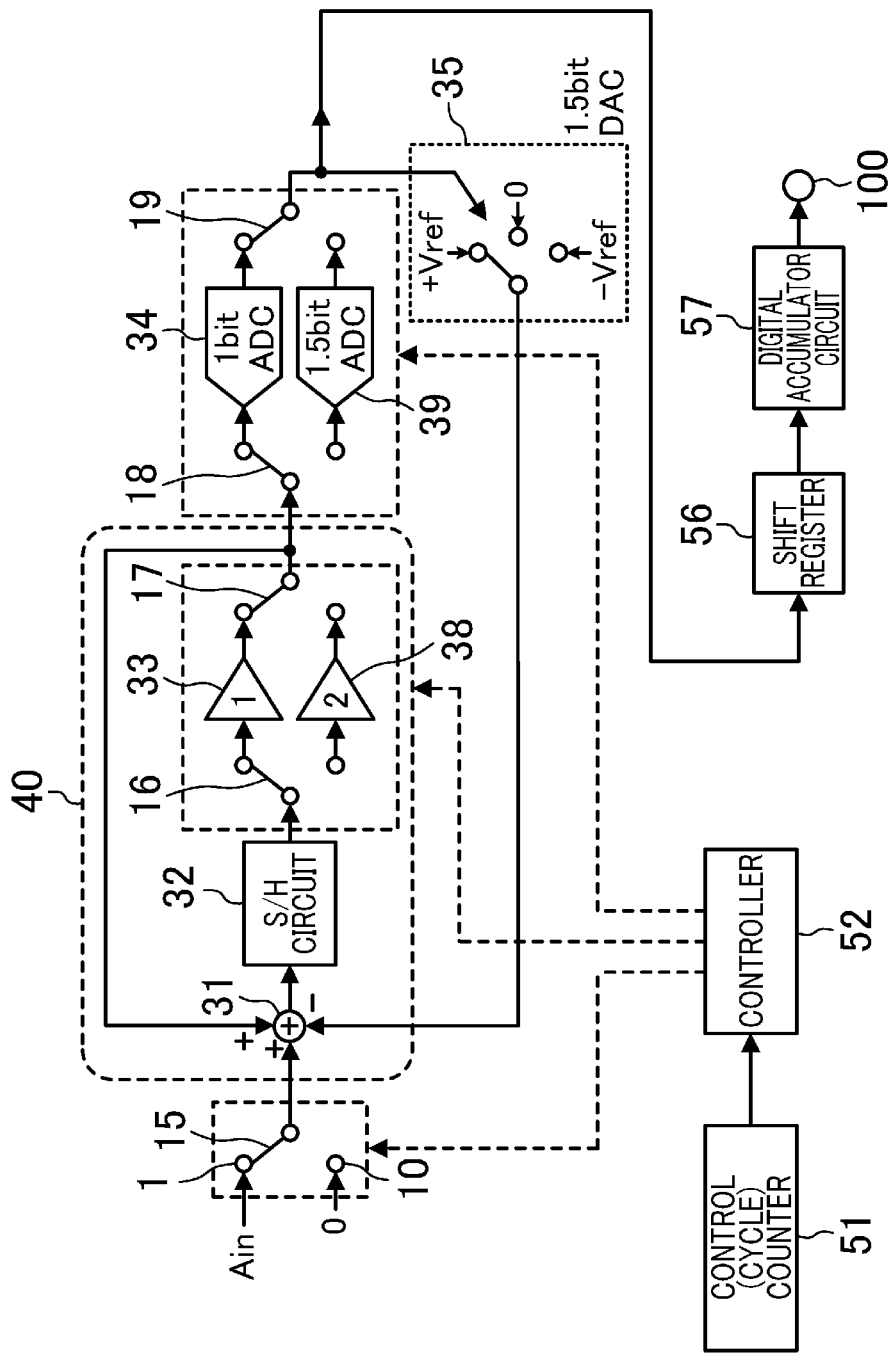
FIG. 5 is a diagram showing an AD converter according to a second embodiment of the present disclosure.

FIG. 5 is a diagram showing an AD converter according to a second embodiment of the present disclosure. In FIG. 5, a control (cycle) counter 51 counts the number of cycles of an externally input clock (not shown) from the beginning of conversion. A controller 52 controls components of the AD converter based on the count output from the cycle counter 51. The controller 52 causes the AD converter to switch between a first, a second, and a third mode so that the AD converter performs conversion.

<<Delta-Sigma Conversion Mode>>

A switch 15 is connected to an input terminal 1 to input an analog input signal Ain of the input terminal 1 to a subtractor 31. An output signal of the subtractor 31 is input to a sample hold circuit 32, which then holds the output signal. The held signal is input through a switch 16 to an amplifier 33, which then amplifies the signal with a gain of one. Note that the signal output from the amplifier 33 is fed back to the subtractor 31, which forms a 1×-gain analog accumulator circuit in an analog accumulator circuit 40.

The output signal of the amplifier 33 is input through a switch 17 and a switch 18 to a sub-AD converter 34, which then performs 1-bit AD conversion. The sub-AD converter 34 outputs a binary digital signal. The binary signal is "+1" or "−1."

The digital output signal of the sub-AD converter 34 is input through a switch 19 to a sub-DA converter 35, which then performs 1-bit DA conversion.

Thus, the subtractor 31, the sample hold circuit 32, the amplifier 33, the sub-AD converter 34, and the sub-DA converter 35 form a closed loop.

Note that when a signal is input for the first time, the output of the sub-DA converter 35 is reset to zero.

A shift register 56 right-shifts the digital output signal of the sub-AD converter 34 by (DSBIT−1) in synchronization with an externally input clock signal (not shown).

When DSBIT is two bits, the signal is right-shifted toward the LSB by one bit as shown in FIG. 2B. A digital accumulator circuit 57 integrates the digital output signal of the shift register 56.

The above operation, which is one cycle, is performed two to the power of DSBIT times to obtain the higher-order bits DSBIT.

<<1×-Gain Cyclic Conversion Mode>>

The switch 15 is connected to an input terminal 10. As an input signal to the input terminal 10 is zero, the sample hold circuit 32 holds a difference between the output of the amplifier 33 and the output of the sub-DA converter 35. The held signal is input through the switch 16 to the amplifier 33, which then amplifies the signal with a gain of one. Note that the signal output from the amplifier 33 is fed back to the subtractor 31, which forms a 1×-gain analog accumulator circuit in the analog accumulator circuit 40.

The output signal of the amplifier 33 is input through the switches 17 and 18 to the sub-AD converter 39, which then performs 1.5-bit AD conversion. The sub-AD converter 39 outputs a ternary digital signal. The ternary signal is "+1," "0," or "−1."

The digital output signal of the sub-AD converter 39 is input to the sub-DA converter 35, which then performs 1.5-bit DA conversion.

The shift register 56 right-shifts the digital output signal of the sub-AD converter 39 by (DSBIT−1). The digital accumulator circuit 57 digitally integrates the digital output signal of the shift register 56.

Thus, accumulation is performed in the same shift amount as that of delta-sigma conversion, and therefore, a conversion result that overlaps the lowest-order bit of delta-sigma conversion is obtained at the output terminal 100. Also, by obtaining such a 1.5-bit result, the 1×-gain cyclic conversion mode and the 2×-gain cyclic conversion mode can be caused to overlap. Note that the initial shift amount in the 2×-gain cyclic conversion mode is DSBIT, which is greater by one than the shift amount (DSBIT−1) of the 1×-gain cyclic conversion mode.

<<2×-Gain Cyclic Conversion Mode>>

The switch 15 is currently connected to the input terminal 10. As the input signal is zero, the sample hold circuit 32 holds a difference between the output of an amplifier 38 and the output of the sub-DA converter 35. The held signal is input through the switch 16 to the amplifier 38, which then amplifies the signal with a gain of two. Note that the signal output from the amplifier 38 is fed back to the subtractor 31, which forms a 2×-gain analog accumulator circuit in the analog accumulator circuit 40.

The output signal of the amplifier 38 is input through the switches 17 and 18 to the sub-AD converter 39, which then performs 1.5-bit AD conversion. The sub-AD converter 39 outputs a ternary digital signal. The ternary signal is "+1," "0," or "−1."

The digital output signal of the sub-AD converter 39 is input to the sub-DA converter 35, which then performs 1.5-bit DA conversion.

The shift register 56 right-shifts the digital output signal of the sub-AD converter 39 by a value that is obtained by adding the current cycle count of the 2×-gain cyclic conversion mode to (DSBIT−1).

The digital accumulator circuit 57 digitally integrates the digital output signal of the shift register 56. In the 2×-gain cyclic conversion mode, the above operation, which is one cycle, is performed CYBIT times to obtain the lower-order bits CYBIT.

Figure 6:
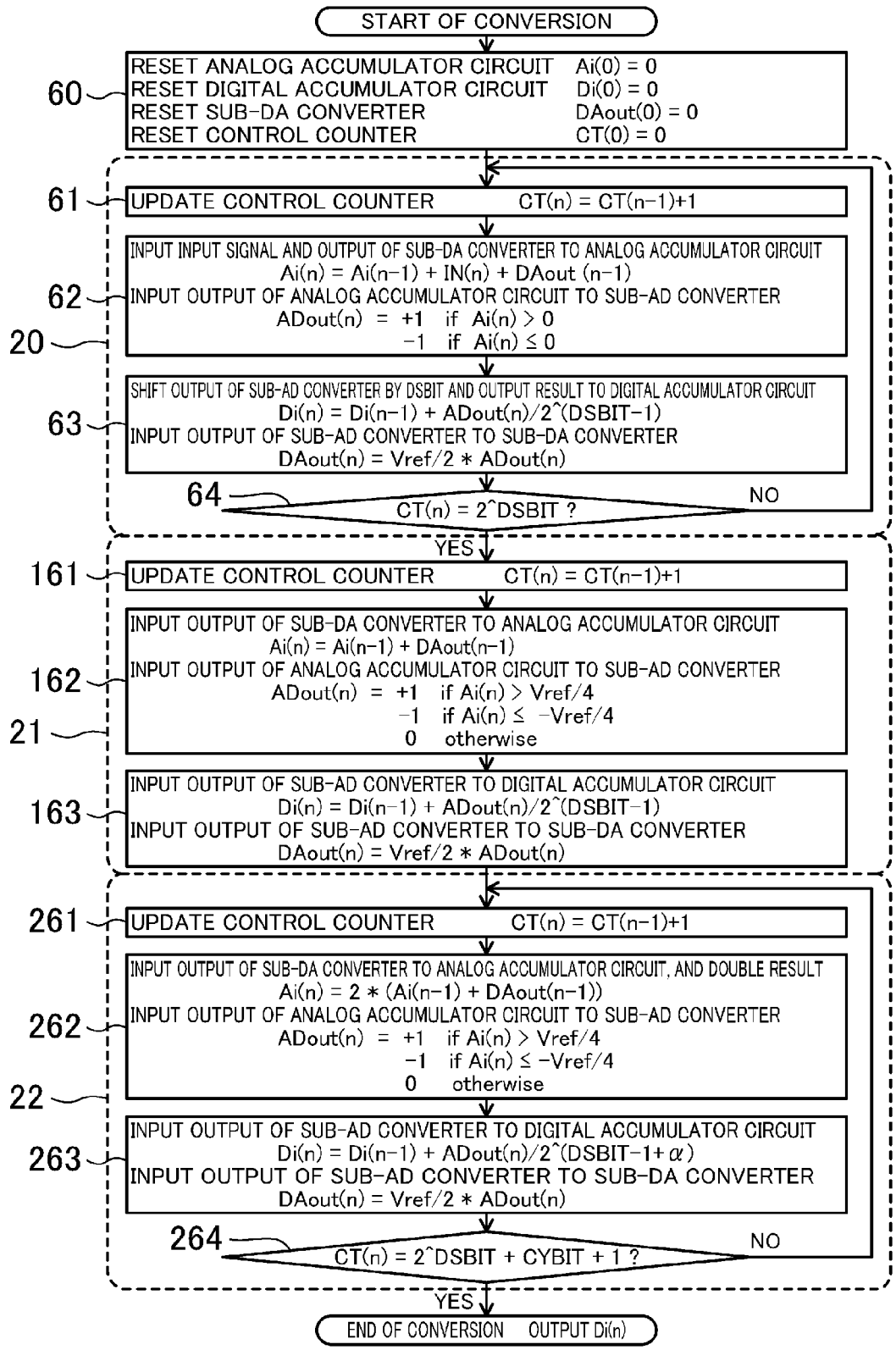
FIG. 6 is a diagram showing steps of conversion performed by an AD converter according to the present disclosure.

FIG. 6 is a diagram showing steps of conversion of the AD converter of the present disclosure. The AD converter of the present disclosure performs conversion in the first, second, and third modes.

The modes correspond to, for example, modes 20-22, respectively, of FIG. 2A. The first mode corresponds to the delta-sigma conversion mode 20. The second mode corresponds to the 1×-gain cyclic conversion mode 21. The third mode corresponds to the 2×-gain cyclic conversion mode 22. The first mode is illustrated in FIG. 3A. The second mode is illustrated in FIG. 3B. The third mode is illustrated in FIG. 3C.

The first, second, and third modes are carried out by, for example, operating the switches 15-19 of FIG. 5.

Steps of FIG. 6 will now be described with reference to FIG. 5.

<<Reset Step>>

The conversion begins with a reset step. The reset step 60 of FIG. 6 begins by resetting the cycle counter 51, the sample hold circuit 32, the sub-AD converters 34 and 39, and the digital accumulator circuit 57 of FIG. 5.

For an n-th clock n (n is a natural number), the output of the control counter 51 is represented by CT(n), the output of the sample hold circuit 32 is represented by Ai(n), the output of the sub-DA converter 35 is represented by DAout(n), and the output of the digital accumulator circuit 57 is represented by Di(n). During resetting, the value of n is zero, and therefore:

CT(0)=0
Ai(0)=0
DAout(0)=0
Di(0)=0

<<First Mode>>

Next, the first mode 20 includes a first count step 61, a first conversion step 62, a second conversion step 63, and a first determination step 64.

In the first count step 61, the control counter 51 is updated by:

$$CT(n)=CT(n-1)+1$$

In the first conversion step 62, the input signal Ain and the output of the sub-DA converter 35 are input to the analog accumulator circuit 40, so that the sample hold circuit 32 outputs:

$$Ai(n)=Ai(n-1)+IN(n)+DAout(n-1)$$

Next, the output of the sample hold circuit 32 is input to the sub-AD converter 34 to obtain:

ADout(n)=+1 if Ai(n)>0
−1 if Ai(n)≤0

In the second conversion step 63, the output of the sub-AD converter 34 is right-shifted by DSBIT, and the result is input to the digital accumulator circuit 57 to obtain:

$$Di(n)=Di(n-1)+ADout(n)/2^{\wedge}(DSBIT-1)$$

where 2^(DSBIT−1) means two to the power of (DSBIT−1).

Moreover, the output of the sub-AD converter 34 is input to the sub-DA converter 35 to obtain:

$$DAout(n)=Vref/2\times ADout(n)$$

In the first determination step 64, it is determined whether or not the control counter output CT(n) is equal to two to the power of DSBIT. If the determination result is positive (YES), control proceeds to the next mode. Otherwise (NO), the control counter 51 is updated, and the first conversion step 62, the second conversion step 63, and the first determination step 64 are repeated.

When the higher-order bits are two bits, each step is performed four times.

<<Second Mode>>

The second mode 21 includes a second count step 161, a third conversion step 162, and a fourth conversion step 163.

In the second count step 161, the control counter 51 is updated by:

$$CT(n)=CT(n-1)+1$$

In the third conversion step 162, the output of the sub-DA converter 35 is input to the sample hold circuit 32 to obtain:

$$Ai(n)=Ai(n-1)+DAout(n-1)$$

Moreover, the output of the sample hold circuit 32 is input to the sub-AD converter 39 to obtain:

ADout(n)=+1 if Ai(n)>Vref/4
−1 if Ai(n)≤−Vref/4
0 otherwise

In the fourth conversion step 163, the output of the sub-AD converter 39 is input to the digital accumulator circuit 57 to obtain:

$$Di(n)=Di(n-1)+ADout(n)/2^{\wedge}(DSBIT-1)$$

The output of the sub-AD converter 39 is input to the 1.5-bit sub-DA converter 35 to obtain:

$$DAout(n)=Vref/2\times ADout(n)$$

<<Third Mode>>

The third mode 22 includes a third count step 261, a fifth conversion step 262, a sixth conversion step 263, and a second determination step 264.

In the third count step 261, the control counter 51 is updated by:

$$CT(n)=CT(n-1)+1$$

In the fifth conversion step 262, the output of the sub-DA converter 35 is input to the sample hold circuit 32, which then doubles the output to obtain:

$$Ai(n)=2\times(Ai(n-1)+DAout(n-1))$$

Next, the output of the sample hold circuit 32 is input to the sub-AD converter 39 to obtain:

ADout(n)=+1 if Ai(n)>Vref/4
−1 if Ai(n)≤−Vref/4
0 otherwise

In the sixth conversion step 263, the output of the sub-AD converter 39 is input to the digital accumulator circuit 57 to obtain:

$$Di(n)=Di(n-1)+ADout(n)/2^{\wedge}(DSBIT-1+\alpha)$$

where α represents the number of times the third mode 22 is performed. The output of the sub-AD converter 39 is input to the 1.5-bit sub-DA converter 35 to obtain:

$$DAout(n)=Vref/2\times ADout(n)$$

In the second determination step 264, it is determined whether or not the output of the control counter 51 is equal to the following value:

$$CT(n)=2^{\wedge}DSBIT+CYBIT+1$$

If the determination result is positive (YES), the conversion is ended. Otherwise (NO), the control counter 51 is updated, and the fifth conversion step 262, the sixth conversion step 263, and the second determination step 264 are repeated.

When the lower-order bits are CYBIT bits, each step is performed CYBIT times.

Third Embodiment

Figure 7:
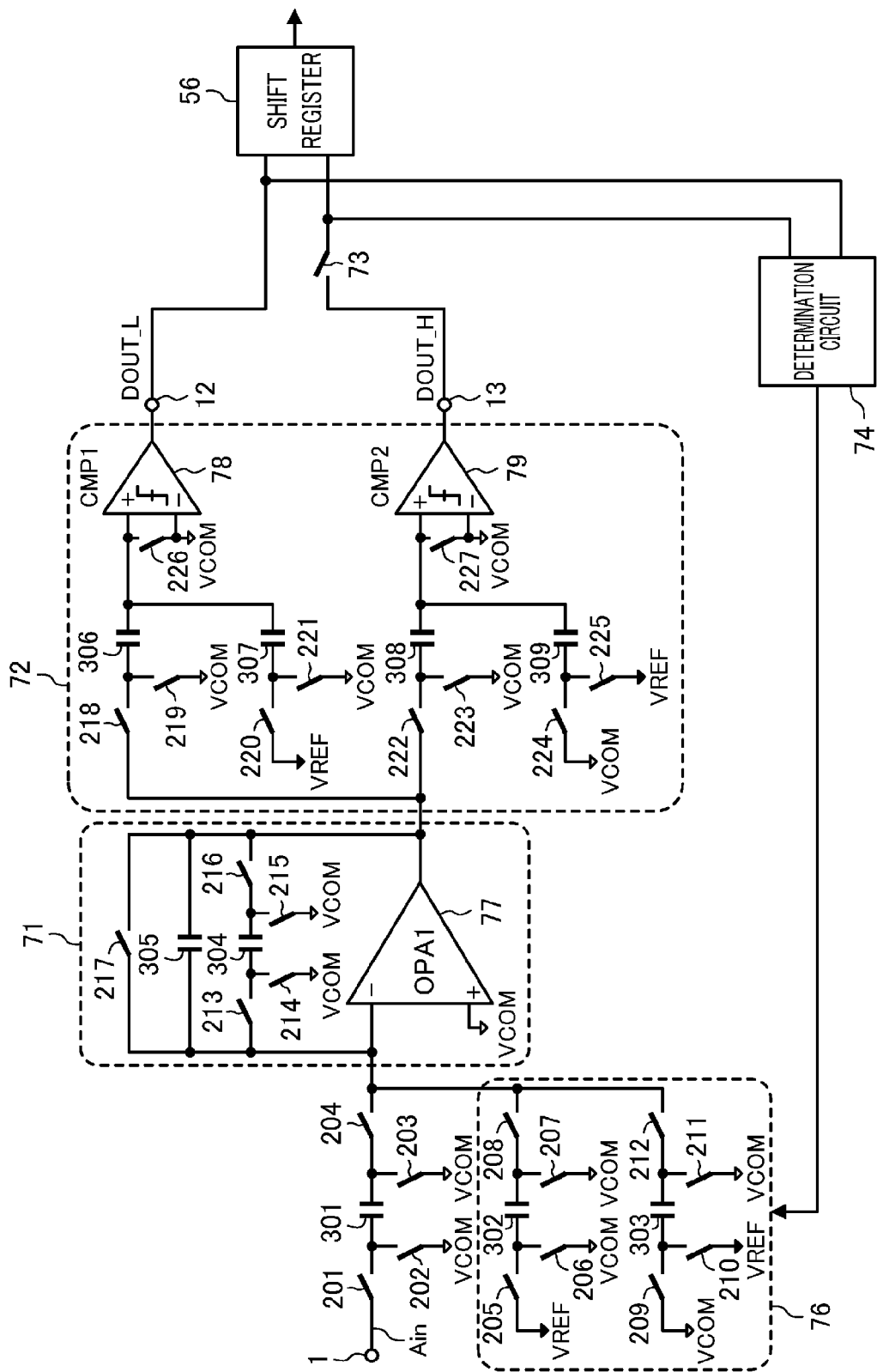
FIG. 7 is a circuit diagram showing an AD converter according to a third embodiment of the present disclosure.

FIG. 7 is a circuit diagram showing an AD converter according to a third embodiment of the present disclosure. In FIG. 7, an analog accumulator circuit and a 2×-gain amplifier are implemented by an analog accumulator circuit 71 having an amplification function. The analog accumulator circuit 71 includes switches 213-217, capacitors 304 and 305, and an operational amplifier 77. The AD converter of FIG. 7 further includes switches 201-204 and a capacitor 301 between an input terminal 1 and the operational amplifier 77.

A sub-AD converter 72 includes switches 218-227, capacitors 306-309, and comparators 78 and 79 connected to output terminals 12 and 13. The AD converter of FIG. 7 further includes a switch 73 and a determination circuit 74.

A sub-DA converter 76 includes switches 205-212 and capacitors 302 and 303.

Note that, in FIG. 7, a first reference voltage VCOM is lower than a second reference voltage VREF.

The capacitors 304 and 305 have equal capacitance values.

<<Delta-Sigma Conversion Mode>>

To set the operational amplifier 77 to have a gain of one, the switches 213 and 216 are turned on and the switches 214 and 215 are turned off.

The output of the output terminal 12 and the output of the output terminal 13 are separately input to the determination circuit 74. Based on the determination result, each switch of the sub-DA converter 76 is controlled. Note that, in the delta-sigma conversion mode, the output of the output terminal 13 is shut off from a channel to the determination circuit 74 by the switch 73.

In the delta-sigma conversion mode, the switches 201 and 203 are turned on, so that the capacitor 301 is charged by the analog input signal Ain input through the input terminal 1, where the first reference voltage VCOM is a reference. Next, the switches 201 and 203 are turned off and the switches 202 and 204 are turned on, so that the operational amplifier 77 performs integration using charge and discharge performed among the capacitors 301, 304, and 305, where the first reference voltage VCOM is a reference. Here, one input terminal of the operational amplifier 77 is connected to the first reference voltage VCOM, and therefore, the other input terminal is virtually grounded. On the other hand, the opposite ends of the capacitor 301 respectively have the first reference voltage VCOM, and therefore, charge is moved from the capacitor 301 to the capacitor 305.

In the sub-AD converter 72, charge of the capacitor 306 is reset by the switches 219 and 226 being turned on. Next, the switches 219 and 226 are turned off and the switch 218 is turned on, so that the positive input voltage of the comparator 78 becomes equal to the output voltage of the operational amplifier 77. As a result, 1-bit AD conversion is performed where the first reference voltage VCOM, which is the negative input voltage of the comparator 78, is a threshold.

The sub-DA converter 76 is controlled by the determination circuit 74 as follows.

[DOUT_L: Low]

When a digital signal DOUT_L of the output terminal 12 of the sub-AD converter 72 is low, the switches 205 and 207 are turned on, so that the capacitor 302 is charged by the second reference voltage VREF, where VCOM is a reference voltage. Next, the switches 206 and 208 are turned on, so that the positive charge accumulated in the capacitor 302 by a difference voltage between the second reference voltage VREF and the first reference voltage VCOM is integrated by the operational amplifier 77. Here, charge and discharge are performed among the capacitors 302, 304, and 305, where the first reference voltage VCOM is a reference.

[DOUT_L: High]

When the digital signal DOUT_L of the output terminal 12 of the sub-AD converter 72 is high, the switches 209 and 211 are turned on, so that charge of the capacitor 303 is reset. Next, the switches 210 and 212 are turned on, so that negative charge accumulated in the capacitor 303 by a difference voltage between the first reference voltage VCOM and the second reference voltage VREF is accumulated in the operational amplifier 77. Here, charge and discharge are performed among the capacitors 303, 304, and 305, where the first reference voltage VCOM is a reference. Note that when a signal is input for the first time where the sub-AD converter 72 is not operated, the sub-DA converter 76 is not operated.

<<1×-Gain Cyclic Conversion Mode>>

In the 1×-gain cyclic conversion mode, the switches 201-204 are not operated, and the analog input signal Ain is not input.

In the analog accumulator circuit 71, to set the operational amplifier 77 to have a gain of one, the switches 213 and 216 are turned on and the switches 214 and 215 are turned off.

In the sub-AD converter 72, the switches 219, 221, and 226 are turned on, so that charge of the capacitors 306 and 307 is reset. Next, the switches 219, 221, and 226 are turned off and the switches 218 and 220 are turned on, so that the positive input voltage of the comparator 78 is determined. Here, charge is redistributed between the capacitors 306 and 307, where the output voltage of the operational amplifier 77 and the second reference voltage VREF are a reference.

For example, when the output voltage of the operational amplifier 77 is equal to the first reference voltage VCOM, the positive input voltage of the comparator 78 is VCOM+(VREF−VCOM)×C7/(C6+C7), and the negative input voltage of the comparator 78 is VCOM, where C6 represents the capacitance value of the capacitor 306 and C7 represents the capacitance value of the capacitor 307. This is equivalent to that the threshold of the comparator 78 is VCOM−(VREF−VCOM)×C7/(C6+C7).

The switches 223, 225, and 227 are simultaneously turned on, so that charge of the capacitor 308 is reset, and therefore, the capacitor 309 is charged by a difference voltage between VREF and VCOM. Next, the switches 223, 225, and 227 are turned off and the switches 222 and 224 are turned on, so that the positive input voltage of the comparator 79 is determined. Here, charge is redistributed between the capacitors 308 and 309, where the output voltage of the operational amplifier 77 and the first reference voltage VCOM are a reference.

For example, when the output voltage of the operational amplifier 77 is equal to the first reference voltage VCOM, the positive input voltage of the comparator 79 is VCOM−(VREF−VCOM)×C9/(C8+C9), and the negative input voltage of the comparator 79 is VCOM, where C8 represents the capacitance value of the capacitor 308 and C9 represents the capacitance value of capacitor 309. The is equivalent to the threshold of the comparator 79 being equal to VCOM+(VREF−VCOM)×C9/(C8+C9).

Thus, the sub-AD converter 72 performs 1.5-bit AD conversion.

The output of the output terminal 12 and the output of the output terminal 13 are separately input to the determination circuit 74, and based on the determination result, each switch of the sub-DA converter 76 is controlled.

The sub-DA converter 76 is controlled by the determination circuit 74 as follows.

[DOUT_L: Low and DOUT_H: Low]

When the digital signal DOUT_L of the output terminal 12 and the digital signal DOUT_H of the output terminal 13, of the sub-AD converter 72, are both low, the switches 205 and 207 are turned on. As a result, the capacitor 302 is charged by the second reference voltage VREF, where VCOM is a reference.

Next, the switches 206 and 208 are turned on, so that positive charge accumulated in the capacitor 302 by a difference voltage between the second reference voltage VREF and the first reference voltage VCOM is integrated by the operational amplifier 77 using charge and discharge performed among the capacitors 302, 304, and 305, where VCOM is a reference.

[DOUT_L: High and DOUT_H: High]

When the digital signal DOUT_L of the output terminal 12 and the digital signal DOUT_H of the output terminal 13, of the sub-AD converter 72, are both high, the switches 209 and 211 are turned on, so that charge of the capacitor 303 is reset.

Next, the switches 210 and 212 are turned on, so that one terminal voltage of the capacitor 303 is the voltage VREF, which is higher than the virtual ground voltage VCOM of the operational amplifier 77. As a result, charge of the capacitors 304 and 305 is distributed to the capacitor 303.

[DOUT_L: High and DOUT_H: Low]

When the DOUT_L of the output terminal 12 is high and the DOUT_H of the output terminal 13 is low, the sub-DA converter 76 is not operated.

[DOUT_L: Low and DOUT_H: High]

When the DOUT_L of the output terminal 12 is low and the DOUT_H of the output terminal 13 is high, the determination circuit 74 does not output a signal.

<<2x-Gain Cyclic Conversion Mode>>

In the 2x-gain cyclic conversion mode, the switches 201-204 are not operated, and the analog input signal Ain is not input.

In the analog accumulator circuit 71, the switches 214 and 216 are turned on, so that the capacitor 304 is charged by the output voltage of the operational amplifier 77, where VCOM is a reference. Next, the switches 213 and 215 are turned on, so that the output voltage of the operational amplifier 77 is accumulated by the operational amplifier 77. Note that charge and discharge performed between the capacitors 304 and 305, where the first reference voltage VCOM is a reference, are used in the accumulation. Here, the capacitors 304 and 305 have equal capacitance values, and therefore, the output voltage of the operational amplifier 77 is amplified by a factor of two.

In the 2x-gain cyclic conversion mode, the sub-AD converter 72 and the sub-DA converter 76 are operated in a manner similar to that in the 1x-gain cyclic conversion mode.

Here, it is desirable that the capacitance values C2 and C3 of the capacitors 302 and 303 be ½ of the capacitance value C1 of the capacitor 301, and the capacitance values C4 and C5 of the capacitors 304 and 305 be equal to the capacitance value C1 of the capacitor 301. It is also desirable that the capacitance value C8 of the capacitor 308 be equal to the capacitance value C6 of the capacitor 306, and the capacitance values C7 and C9 of the capacitors 307 and 309 are ⅛ of the capacitance value C6 of the capacitor 306.

However, for example, to double the input range, the capacitance value C1 may be ½ of the above value. Alternatively, for example, to set the output range of the integrator to be twice as large as VREF, the capacitance values C2, C3, C7, and C9 of the capacitors 302, 303, 307, and 309 may be twice as high as the above values.

Fourth Embodiment

Figure 8:
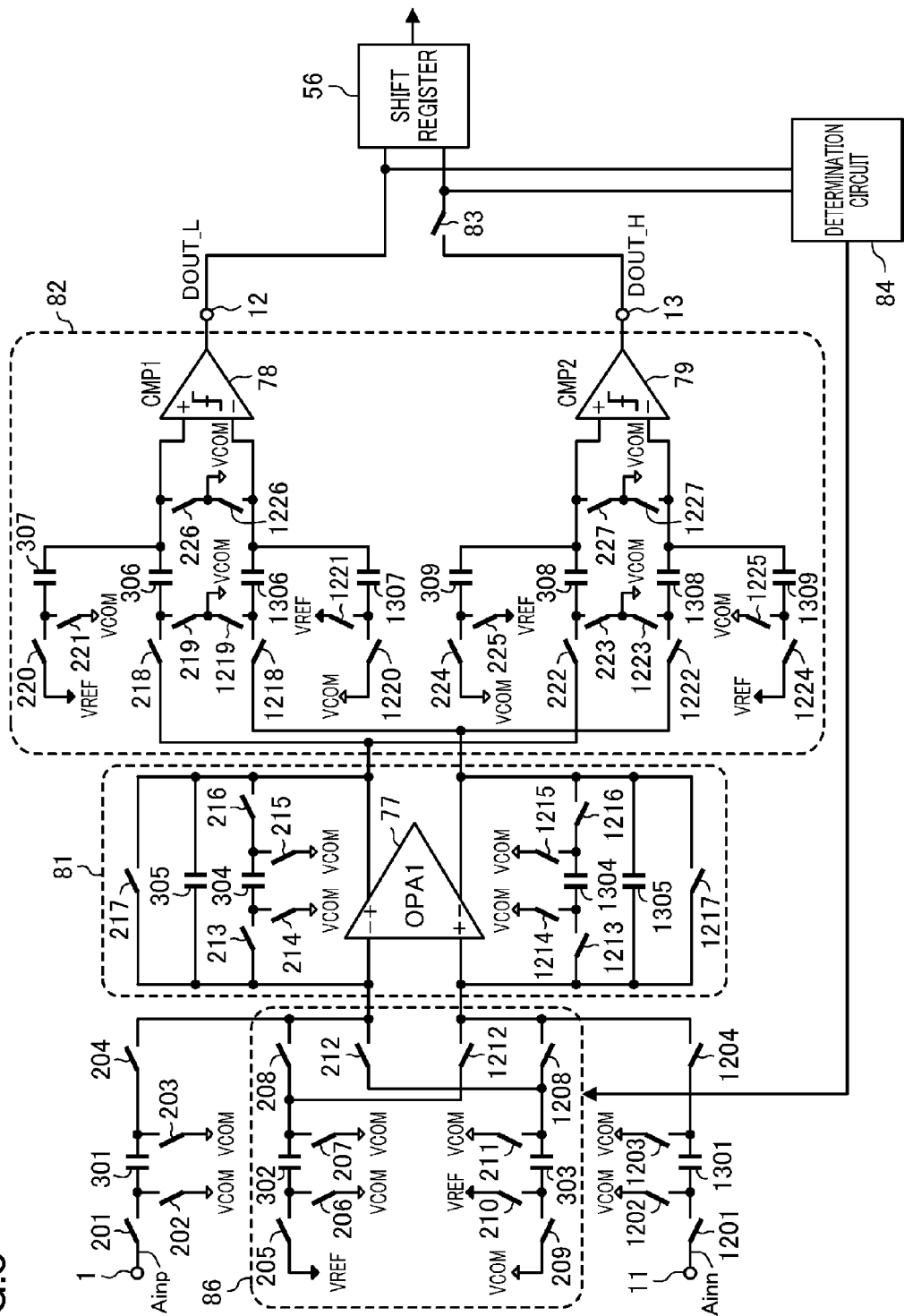
FIG. 8 is a circuit diagram showing an AD converter according to a fourth embodiment of the present disclosure.

FIG. 8 is a diagram showing an AD converter according to a fourth embodiment of the present disclosure. As shown in FIG. 8, the influence of power supply noise, etc., can be reduced by using a differential version of the AD converter.

In the AD converter of FIG. 8, an input terminal 1 that receives a positive analog input signal Ainp is connected to a circuit including switches 201-204 and a capacitor 301. An input terminal 11 that receives a negative analog input signal Ainn is connected to a circuit including switches 1201-1204 and a capacitor 1301.

An analog accumulation function and a 2x-gain amplification function are provided by an analog accumulator circuit 81 having an amplification function, which includes an operational amplifier 77. The analog accumulator circuit 81 also includes switches 213-217, and capacitors 304 and 305, between the non-inverting input terminal and inverting output terminal of the operational amplifier 77. The analog accumulator circuit 81 also includes switches 1213-1217, and capacitors 1304 and 1305, between the inverting input terminal and non-inverting output terminal of the operational amplifier 77.

A sub-AD converter 82 receives an inverting input terminal output of the operational amplifier 77 through switches 218-227, capacitors 306-309, the positive input terminal of a comparator 78, and the positive input terminal of a comparator 79. The sub-AD converter 82 also receives a non-inverting input terminal output of the operational amplifier 77 through switches 1218-1227, capacitors 1306-1309, the negative input terminal of the comparator 78, and the negative input terminal of the comparator 79.

This AD converter also includes a shift register 56, a switch 83, and a determination circuit 84 that receive output signals of the comparators 78 and 79.

A sub-DA converter 86 includes switches 205-212, switches 1208 and 1212, and capacitors 302 and 303.

Note that, in FIG. 8, a first reference voltage VCOM is lower than a second reference voltage VREF.

The capacitors 304 and 305 have equal capacitance values, and the capacitors 1304 and 1305 have equal capacitance values.

<<Delta-Sigma Conversion Mode>>

To set the operational amplifier 77 to have a gain of one, the switches 213 and 216 are turned on and the switches 214 and 215 are turned off. Also, the switches 1213 and 1216 are turned on and the switches 1214 and 1215 are turned off.

The output DOUT_L of the output terminal 12 and the output DOUT_H of the output terminal 13 are separately input to the determination circuit 84. Based on the determination result, each switch of the sub-DA converter 86 is controlled. Note that, in the delta-sigma conversion mode, the output of the output terminal 13 is shut off from a channel to the determination circuit 84 by the switch 83.

In the delta-sigma conversion mode, the switches 201 and 203 are turned on, so that the capacitor 301 is charged by the analog input signal Ainp input through the input terminal 1, where the first reference voltage VCOM is a reference. Next, the switches 201 and 203 are turned off and the switches 202 and 204 are turned on, so that integration is performed by the operational amplifier 77 using charge and discharge performed among the capacitors 301, 304, and 305, where the first reference voltage VCOM is a reference. Here, the differential input terminal of the operational amplifier 77 is virtually grounded to the first reference voltage VCOM, so that the voltages of the opposite ends of the capacitor 301 are respectively equal to the first reference voltage VCOM, and therefore, charge is moved from the capacitor 301 to the capacitor 305.

Similarly, the switches 1201 and 1203 are turned on, so that the capacitor 1301 is charged by the analog input signal Ainn input through the input terminal 11, where the first reference voltage VCOM is a reference. Next, the switches 1201 and 1203 are turned off and the switches 1202 and 1204 are turned on, so that integration is performed by the operational amplifier 77 using charge and discharge performed among the capacitors 1301, 1304, and 1305, where the first reference voltage VCOM is a reference. Here, the differential input terminal of the operational amplifier 77 is virtually grounded to the first reference voltage VCOM, so that the voltages of the opposite ends of the capacitor 1301 are respectively equal to the first reference voltage VCOM, and therefore, charge is moved from the capacitor 1301 to the capacitor 1305.

In the sub-AD converter 82, the switches 219, 1219, 226, and 1226 are turned on, so that charge of the capacitors 306 and 1306 is reset. Next, the switches 219, 1219, 226, and 1226 are turned off and the switches 218 and 1218 are turned on, so that the positive input voltage of the comparator 78 becomes equal to the positive output voltage of the operational amplifier 77. As a result, the negative input voltage of the comparator 78 becomes equal to the negative output voltage of the operational amplifier 77, so that 1-bit AD conversion is performed.

The sub-DA converter 86 is controlled by the determination circuit 84 as follows.

[DOUT_L: Low]

When the digital signal DOUT_L of the output terminal 12 of the sub-AD converter 82 is low, the switches 205 and 207 are turned on, so that the capacitor 302 is charged by the second reference voltage VREF, where VCOM is a reference voltage, and the switches 209 and 211 are turned on, so that charge of the capacitor 303 is reset. Next, the switches 206 and 208 are turned on, so that positive charge accumulated in the capacitor 302 by a difference voltage between VREF and VCOM is integrated by the operational amplifier 77. At the same time, the switches 210 and 1208 are turned on, so that negative charge accumulated in the capacitor 303 by a difference voltage between the first reference voltage VCOM and the second reference voltage VREF is accumulated in the operational amplifier 77.

[DOUT_L: High]

When the digital signal DOUT_L of the output terminal 12 of the sub-AD converter 82 is high, the switches 209 and 211 are turned on, so that charge of the capacitor 303 is reset. Also, the switches 205 and 207 are turned on, so that the capacitor 302 is charged by the second reference voltage VREF, where the first reference voltage VCOM is a reference. Next, the switches 210 and 212 are turned on, so that negative charge accumulated in the capacitor 303 by a difference voltage between VCOM and VREF is accumulated in the operational amplifier 77. At the same time, the switches 206 and 1212 are turned on, so that positive charge accumulated in the capacitor 302 due to a difference voltage between VREF and VCOM is accumulated in the operational amplifier 77.

Note that when a signal is input for the first time where the sub-AD converter 82 is not operated, the sub-DA converter 86 is not operated.

<<1×-Gain Cyclic Conversion Mode>>

In the 1×-gain cyclic conversion mode, the switches 201-204 are not operated, and the analog input signal Ainp is not input. Also, the switches 1201-1204 are not operated, and the analog input signal Ainn is not input.

In the analog accumulator circuit 81, to set the operational amplifier 77 to have a gain of one, the switches 213 and 216 are turned on and the switches 214 and 215 are turned off. Also, the switches 1213 and 1216 are turned on and the switches 1214 and 1215 are turned off.

In the sub-AD converter 82, the switches 219, 221, and 226 are turned on, so that charge of the capacitors 306 and 307 is reset, and the switches 1219, 1221, and 1226 are turned on, so that charge of the capacitor 1306 is reset, and the capacitor 1307 is charged by a difference voltage between VREF and VCOM. Next, the switches 219, 221, and 226 are turned off and the switches 218 and 220 are turned on, so that the positive input voltage of the comparator 78 is determined. At the same time, the switches 1219, 1221, and 1226 are turned off and the switches 1218 and 1220 are turned on, so that the negative input voltage of the comparator 78 is determined.

For example, when the positive and negative output voltages of the operational amplifier 77 are equal to the first reference voltage VCOM, the positive input voltage of the comparator 78 is VCOM+(VREF−VCOM)×C7/(C6+C7), and the negative input voltage of the comparator 78 is VCOM−(VREF−VCOM)×C7/(C6+C7). This is equivalent to the threshold of the comparator 78 being −2×(VREF−VCOM)×C7/(C6+C7). Here, C6 represents the capacitance values of the capacitors 306 and 1306, and C7 represents the capacitance values of the capacitors 307 and 1307.

The switches 223, 225, and 227 are simultaneously turned on, so that charge of the capacitor 308 is reset, and the capacitor 309 is charged by a difference voltage between VREF and VCOM. The switches 1223, 1225, and 1227 are turned on, so that charge of the capacitors 1308 and 1309 is reset. Next, the switches 223, 225, and 227 are turned off and the switches 222 and 224 are turned on, so that the positive input voltage of the comparator 79 is determined. At the same time, the switches 1223, 1225, and 1227 are turned off and the switches 1222 and 1224 are turned on, so that the negative input voltage of the comparator 79 is determined.

For example, when the positive and negative output voltages of the operational amplifier 77 are equal to the first reference voltage VCOM, the positive input voltage of the comparator 79 is VCOM−(VREF−VCOM)×C9/(C8+C9), and the negative input voltage of the comparator 79 is VCOM+(VREF−VCOM)×C9/(C8+C9). This is equivalent to the threshold of the comparator 79 being 2×(VREF−VCOM)×C9/(C8+C9). Here, C8 represents the capacitance values of the capacitors 308 and 1308, and C9 represents the capacitance values of capacitors 309 and 1309.

Thus, the sub-AD converter 82 performs 1.5-bit AD conversion.

The sub-DA converter 86 is controlled by the determination circuit 84 as follows.

[DOUT_L: Low and DOUT_H: Low]

In the sub-DA converter 86, when the digital signal DOUT_L of the output terminal 12 and the digital signal DOUT_H of the output terminal 13, of the sub-AD converter 82, are both low, the switches 205 and 207 are turned on, so that the capacitor 302 is charged by the second reference voltage VREF, where VCOM is a reference voltage, and the switches 209 and 211 are turned on, so that charge of the capacitor 303 is reset. Next, the switches 206 and 208 are turned on, so that positive charge accumulated in the capacitor 302 by a difference voltage between VREF and VCOM is integrated by the operational amplifier 77. At the same time, the switches 210 and 1208 are turned on, so that negative charge accumulated in the capacitor 303 by a difference voltage between the first reference voltage VCOM and the second reference voltage VREF is accumulated in the operational amplifier 77.

[DOUT_L: High and DOUT_H: High]

When the digital signal DOUT_L of the output terminal 12 and the digital signal DOUT_H of the output terminal 13, of the sub-AD converter 82, are both high, the switches 209 and 211 are turned on, so that charge of the capacitor 303 is reset. The switches 205 and 207 are turned on, so that the capacitor 302 is charged by the second reference voltage VREF, where the first reference voltage VCOM is a reference. Next, the switches 210 and 212 are turned on, so that negative charge accumulated in the capacitor 303 by a difference voltage between VCOM and VREF is accumulated in the operational amplifier 77. At the same time, the switches 206 and 1212 are turned on, so that positive charge accumulated in the capacitor 302 by a difference voltage between VREF and VCOM is accumulated in the operational amplifier 77.

[DOUT_L: High and DOUT_H: Low]

When the DOUT_L of the output terminal 12 is high and the DOUT_H of the output terminal 13 is low, the sub-DA converter 86 is not operated.

[DOUT_L: low, DOUT_H: High]

When the DOUT_L of the output terminal 12 is low and the DOUT_H of the output terminal 13 is high, the determination circuit 84 does not output a signal.

<<2×-Gain Cyclic Conversion Mode>>

In the 2×-gain cyclic conversion mode, the switches 201-204 are not operated, and the analog input signal Ainp is not input. The switches 1201-1204 are not operated, and the analog input signal Ainn is not input.

In the analog accumulator circuit 81, the switches 214 and 216 are turned on, so that the capacitor 304 is charged by the positive output voltage of the operational amplifier 77, where VCOM is a reference, and the switches 1214 and 1216 are turned on, so that the capacitor 1304 is charged by the negative output voltage of the operational amplifier 77, where VCOM is a reference. Next, the switches 213 and 215 are turned on, so that accumulation is performed by the operational amplifier 77 using charge and discharge performed between the capacitors 304 and 305, where VCOM is a reference. In addition, the switches 1213 and 1215 are turned on, so that accumulation is performed by the operational amplifier 77 using charge and discharge performed between the capacitors 1304 and 1305, where VCOM is a reference. Here, the capacitors 304, 305, 1304, and 1305 have equal capacitance values, and therefore, the output voltage of the operational amplifier 77 is amplified by a factor of two.

In the 2×-gain cyclic conversion mode, the sub-AD converter 82 and the sub-DA converter 86 are operated in a manner similar to that of the 1×-gain cyclic conversion mode.

Here, it is desirable that the capacitance values C2 and C3 of the capacitors 302 and 303 be ½ of the capacitance values C1 of the capacitors 301 and 1301, and the capacitance values C4 and C5 of the capacitors 304, 1304, 305, and 1305 be equal to the capacitance values C1 of the capacitors 301 and 1301. It is also desirable that the capacitance values C8 of the capacitors 308 and 1308 be equal to the capacitance values C6 of the capacitors 306 and 1306, and the capacitance values C7 of the capacitors 307 and 1307 and the capacitance values C9 of the capacitors 309 and 1309 be ⅛ of the capacitance values C6 of the capacitors 306 and 1306.

Fifth Embodiment

Figure 9:
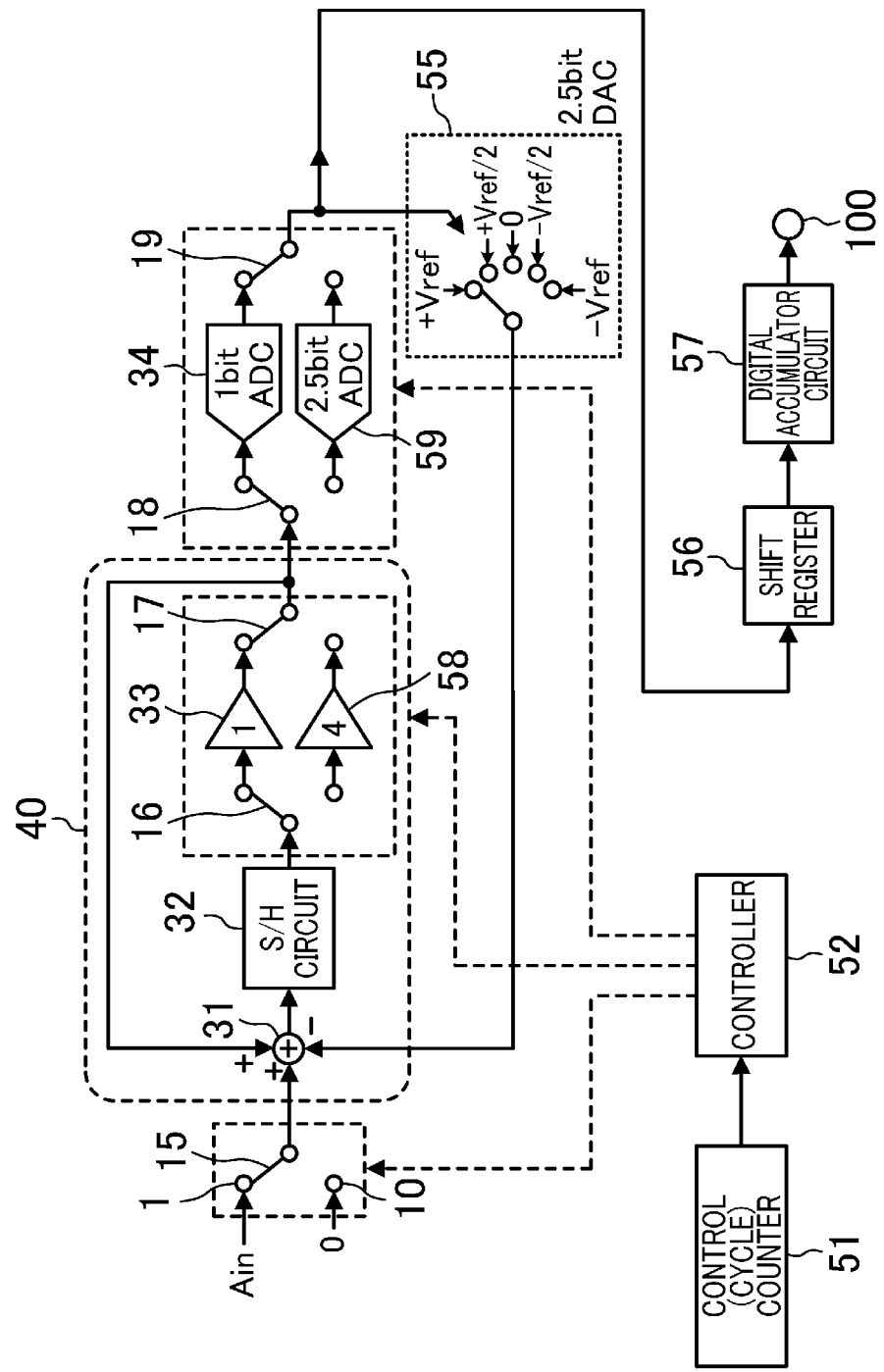
FIG. 9 is a diagram showing an AD converter according to a fifth embodiment of the present disclosure.

FIG. 9 is a diagram showing an AD converter according to a fifth embodiment of the present disclosure. In the AD converter of FIG. 9, a cycle counter 51 counts the number of cycles of an externally input clock from the beginning of conversion. A controller 52 controls components of the AD converter based on the count output from the cycle counter 51. The controller 52 causes the AD converter to switch between a first, a second, and a third mode so that the AD converter performs conversion.

<<Delta-Sigma Conversion Mode>>

A switch 15 is connected to an input terminal 1 to input an analog input signal Ain input through an input terminal 1 to a subtractor 31. An output signal of the subtractor 31 is held by a sample hold circuit 32. The held signal is input through a switch 16 to an amplifier 33, which then amplifies the signal with a gain of one. Note that the signal output from the amplifier 33 is fed back to the subtractor 31, which forms a 1×-gain analog accumulator circuit in an analog accumulator circuit 40.

The output signal of the amplifier 33 is input through a switch 17 and a switch 18 to a sub-AD converter 34, which then performs 1-bit AD conversion. The sub-AD converter 34 outputs a binary digital signal through a switch 19. The binary signal is "+1" or "−1."

The digital output signal of the sub-AD converter 34 is input through the switch 19 to a sub-DA converter 55, which then performs 1-bit DA conversion.

Thus, the subtractor 31, the sample hold circuit 32, the amplifier 33, the sub-AD converter 34, and the sub-DA converter 55 form a closed loop.

Note that when a signal is input for the first time, the output of the sub-DA converter 55 is reset to zero.

A shift register 56 right-shifts the digital output signal of the sub-AD converter 34 by (DSBIT−1) in synchronization with an externally input clock signal. When DSBIT is two bits, the signal is right-shifted toward the LSB by one bit as shown in FIG. 2B. A digital accumulator circuit 57 integrates the digital output signal of the shift register 56.

The above operation, which is one cycle, is performed two to the power of DSBIT times to obtain the higher-order bits DSBIT.

<<1×-Gain Cyclic Conversion Mode>>

The switch 15 is connected to an input terminal 10. As an input signal to the input terminal 10 is zero, the sample hold circuit 32 holds a difference between the output of the amplifier 33 and the output of the sub-DA converter 55. The held signal is input through the switch 16 to the amplifier 33, which then amplifies the signal with a gain of one. Note that the signal output from the amplifier 33 is fed back to the subtractor 31, which forms a 1×-gain analog accumulator circuit in the analog accumulator circuit 40.

The output signal of the amplifier 33 is input through the switches 17 and 18 to a sub-AD converter 59, which then performs 2.5-bit AD conversion. The sub-AD converter 59 outputs a five-valued digital signal. The five-valued signal is "+1," "+0.5," "0," "−0.5," or "−1."

The digital output signal of the sub-AD converter 59 is input to the sub-DA converter 55, which then performs 2.5-bit DA conversion.

The shift register 56 right-shifts the digital output signal of the sub-AD converter 59 by (DSBIT−1). The digital accumulator circuit 57 digitally integrates the digital output signal of the shift register 56.

By the above operation, a conversion result that overlaps the lowest-order bit of delta-sigma conversion is obtained. Also, by obtaining such a 2.5-bit result, a conversion result that overlaps the highest-order bit of a 4×-gain cyclic conversion mode described next can be obtained.

<<4×-Gain Cyclic Conversion Mode>>

Next, the switch 15 is currently connected to the input terminal 10. As the input signal is zero, the sample hold circuit 32 holds a difference between the output of the amplifier 33 and the output of the sub-DA converter 55. The held signal is input through the switch 16 to an amplifier 58, which then amplifies the signal with a gain of four. Note that the signal output from the amplifier 58 is fed back to the subtractor 31, which forms a 4×-gain analog accumulator circuit.

The output signal of the amplifier 58 is input through the switches 17 and 18 to the sub-AD converter 59, which then performs 2.5-bit AD conversion. The sub-AD converter 59 outputs a five-valued digital signal. The five-valued signal is "+1," "+0.5," "0," "−0.5," or "−1."

The digital output signal of the sub-AD converter 59 is input to the sub-DA converter 55, which then performs 2.5-bit DA conversion.

The shift register 56 right-shifts the digital output signal of the sub-AD converter 59 by a value that is obtained by adding double the current cycle count to (DSBIT−1) in the 4×-gain cyclic conversion mode.

The digital accumulator circuit 57 accumulates the digital output signal of the shift register 56. In the 4×-gain cyclic conversion mode, the above operation, which is one cycle, is performed CYBIT/2 times to obtain the lower-order bits CYBIT.

Sixth Embodiment

Figure 10:
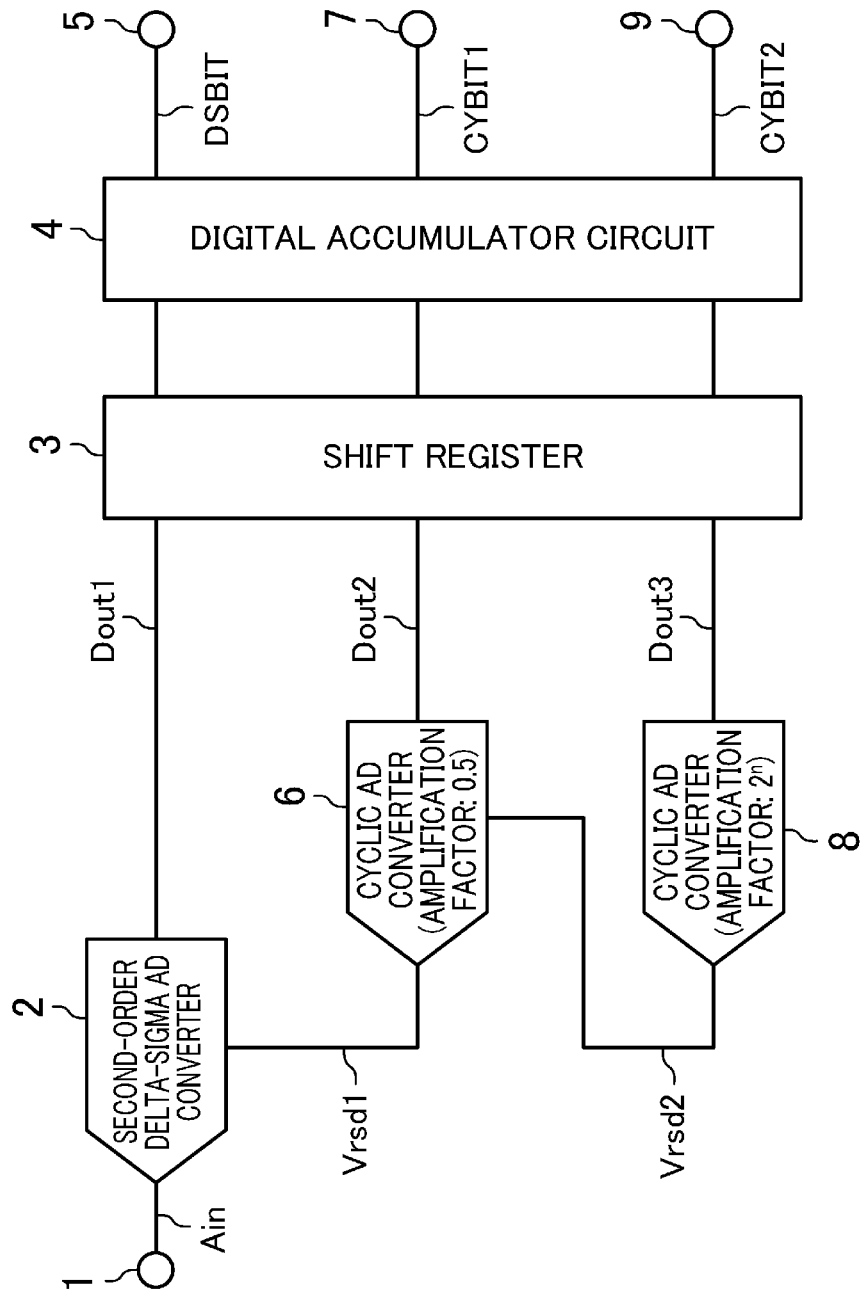
FIG. 10 is a diagram showing an AD converter according to a sixth embodiment of the present disclosure.

FIG. 10 is a diagram showing an AD converter according to a sixth embodiment of the present disclosure. In FIG. 10, a signal is input to an input terminal 1, and the results of conversion are output to output terminals 5, 7, and 9. While the output terminals 5, 7, and 9 are described as separate terminals, the output terminals 5, 7, and 9 may be implemented by a single output terminal that outputs different process results after different elapsed times.

An analog input signal Ain to the input terminal 1 is input to a second-order delta-sigma AD converter 2, which then performs a 1-bit delta-sigma AD conversion process. The delta-sigma AD conversion process outputs a quantized signal Dout1 according to a conversion process cycle. The quantized signal Dout1 is input to a shift register 3, which then performs a shift process. The shifted signal is input to a digital accumulator circuit 4, which then outputs a digitally integrated signal as a higher-order bit signal DSBIT to the output terminal 5. Note that when the higher-order bits are set to be three bits, four cycles of delta-sigma AD conversion are performed.

After the final quantized signal Dout1 is obtained, the digital accumulator circuit 4 outputs the higher-bit signal DSBIT, and the second-order delta-sigma AD converter 2 outputs a residual signal Vrsd1 that is a higher-order bit analog residual signal. The residual signal Vrsd1 is input to a first cyclic AD converter 6, which then performs a 1.5-bit cyclic AD conversion process. The first cyclic AD converter 6 outputs a quantized signal Dout2. At this time, the first cyclic AD converter 6 is set to have an amplification factor of 0.5. The quantized signal Dout2 is input to the shift register 3, which then performs a shift process. The shifted signal is input to the digital accumulator circuit 4, which then outputs an overlap bit signal CYBIT1 of higher-order bits and lower-order bits to the output terminal 7.

Next, the first cyclic AD converter 6 outputs a residual signal Vrsd2 resulting from extraction of the quantized signal Dout2 to a second cyclic AD converter 8, which then performs a cyclic AD conversion process. At this time, the second cyclic AD converter 8 is set to have an amplification factor of two. The second cyclic AD conversion process outputs a quantized signal Dout3 for each cycle. The quantized signal Dout3 is output to the shift register 3, which then performs a shift process. The shifted signal is input to the digital accumulator circuit 4, which then outputs a lower-order bit signal CYBIT2 to the output terminal 9. Note that when the lower-order bits are set to be four bits, five cycles of second cyclic AD conversion are performed.

Figure 11A:
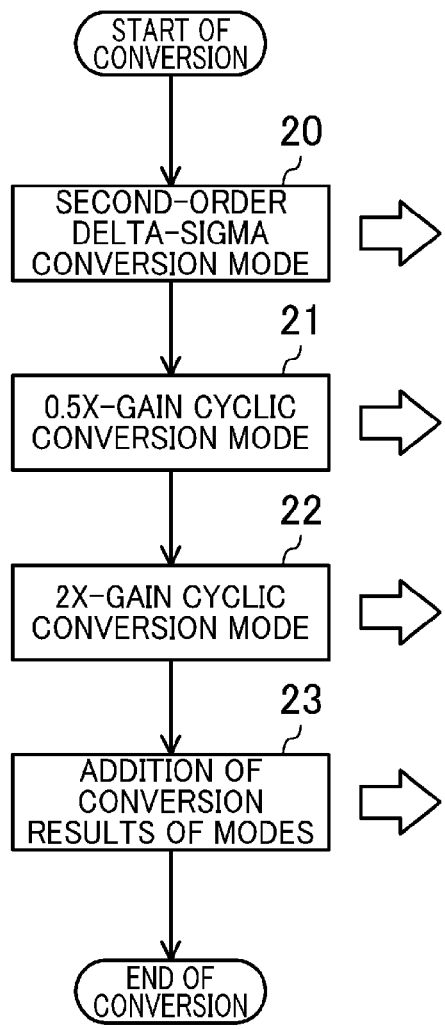
FIG. 11A is a diagram showing a flow of conversion performed by the AD converter of the sixth embodiment of the present disclosure.
Figure 11B:
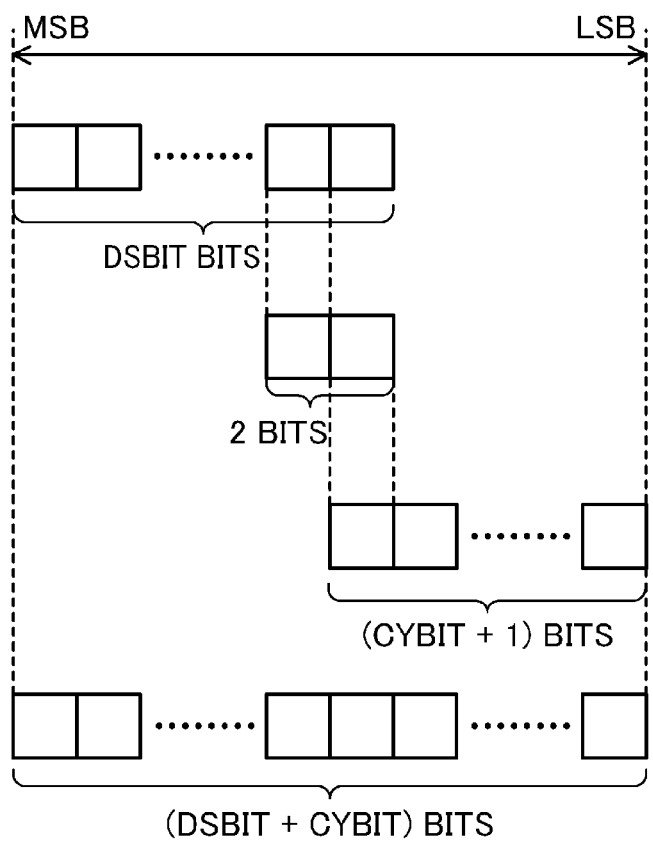
FIG. 11B is a diagram showing the positions of bits in the AD converter of the sixth embodiment of the present disclosure.

FIG. 11A is a diagram showing a flow of conversion performed by the AD converter according to the sixth embodiment. FIG. 11B is a diagram showing the positions (depths) of bits of digital data according to the sixth embodiment.

As shown in FIG. 11A, the AD converter of the present disclosure performs conversion by switching between three operation states (modes). The first mode is a second-order delta-sigma conversion mode 20 in which the AD converter performs second-order delta-sigma AD conversion. The second mode is a 0.5×-gain cyclic conversion mode 21 in which the AD converter performs cyclic AD conversion with a gain of 0.5. The third mode is a 2×-gain cyclic conversion mode 22 in which the AD converter performs cyclic AD conversion with a gain of two.

As shown in FIG. 11B, in the second-order delta-sigma conversion mode 20, the result of conversion of the higher-order bits can be obtained. When the higher-order bits are DSBIT bits, DSBIT conversion results are put in a bit array from the MSB toward the LSB.

As shown in FIG. 11B, in the 0.5×-gain cyclic conversion mode 21, the result of 1.5-bit conversion is obtained. Two bits are allocated to this result.

As shown in FIG. 11B, in the 2×-gain cyclic conversion mode 22, the result of conversion of the lower-order bits (CYBIT+1) can be obtained.

The digital output signals of conversion results in these modes are added together in an addition step 23, to obtain a final AD conversion result. Note that not all the conversion modes have to be completed before the above addition is performed.

Thus, the 1.5 bits obtained in the 0.5×-gain cyclic conversion mode 21 overlaps two bits positioned at the lowest order of the higher-order bit signal DSBIT in a direction from the MSB to the LSB, and also overlaps one bit positioned at the highest order of the lower-order bit signal (CYBIT+1) output in the 2×-gain cyclic conversion mode 22. In other words, an overlap is provided.

Figure 12:
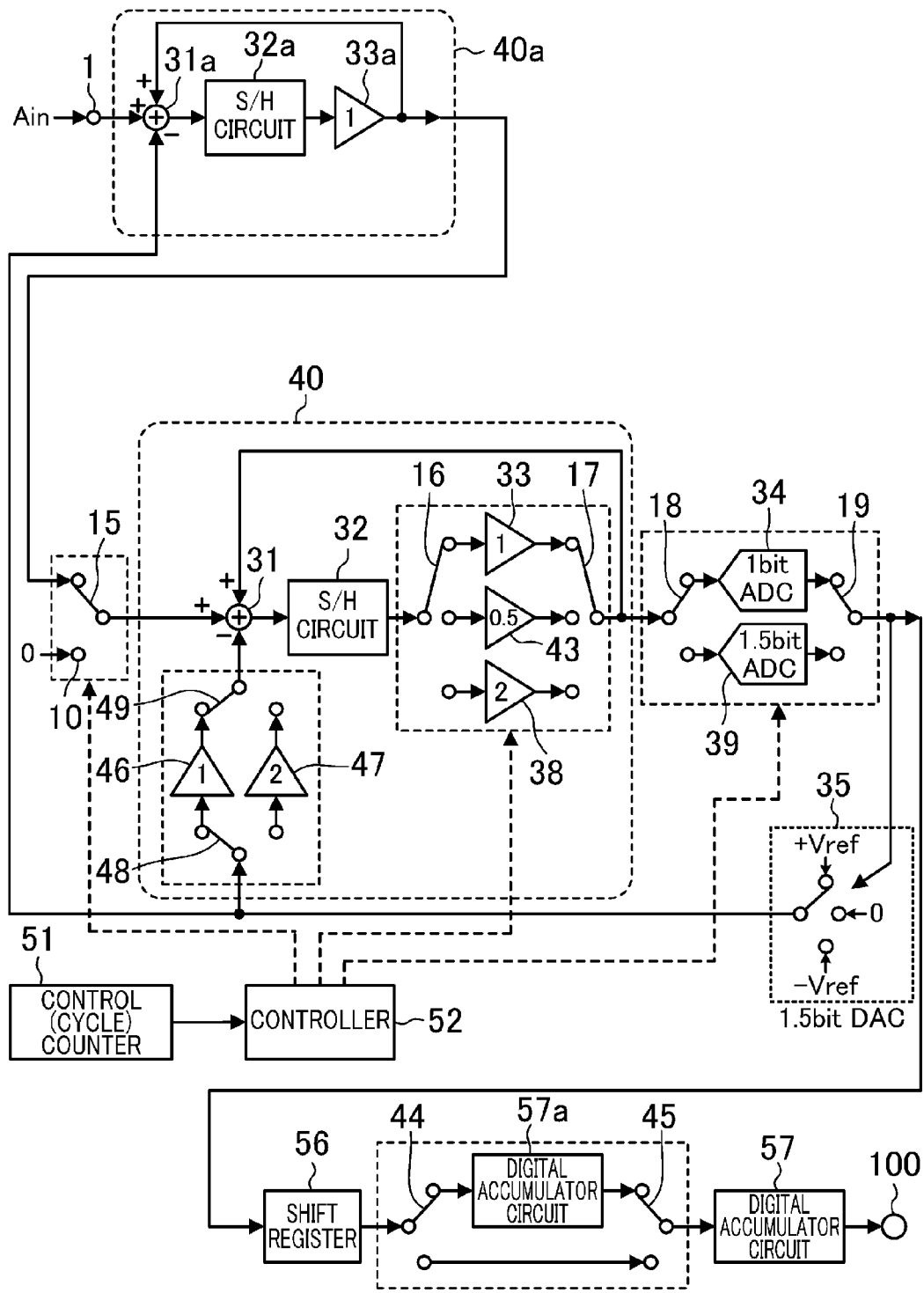
FIG. 12 is a diagram specifically showing the AD converter of the sixth embodiment of the present disclosure.

FIG. 12A is a diagram showing a configuration of the AD converter of the sixth embodiment. In FIG. 12, a control (cycle) counter 51 counts the number of cycles of an externally input clock (not shown) from the beginning of conversion. A controller 52 controls components of the AD converter based on the count output from the cycle counter 51. The controller 52 causes the AD converter to switch between the first, second, and third modes so that the AD converter performs conversion.

<<Second-Order Delta-Sigma Conversion Mode>>

The analog input signal Ain to the input terminal 1 is input to a subtractor 31a. An output signal of the subtractor 31a is input to a sample hold circuit 32a, which then holds the signal. The held signal is input to an amplifier 33a, which then amplifies the signal with a gain of one. Note that the signal output from the amplifier 33a is fed back to the subtractor 31a, which forms a first-stage 1×-gain analog accumulator circuit 40a.

An output of the first-stage analog accumulator circuit 40a is input to a second-stage analog accumulator circuit 40 through a switch 15. The input signal is input to a subtractor 31. An output signal of the subtractor 31 is input to a sample hold circuit 32, which then holds the signal. The held signal is input through a switch 16 to an amplifier 33, which then amplifies the signal with a gain of one. Note that the signal output from the amplifier 33 is fed back to the subtractor 31, which forms the second-stage 1×-gain analog accumulator circuit 40.

An output signal of the second-stage analog accumulator circuit 40 is input through a switch 17 and a switch 18 to a sub-AD converter 34, which then performs 1-bit AD conversion. The sub-AD converter 34 outputs a binary digital signal through a switch 19. The binary signal is "+1" or "−1."

The digital output signal of the sub-AD converter 34 is input through the switch 19 to a sub-DA converter 35, which then performs 1-bit DA conversion. An output of the sub-DA converter 35 is directly fed back to the first-stage analog accumulator circuit 40a, and is also fed back to the second-stage analog accumulator circuit 40 through a 1×-gain amplifier 46.

Thus, the subtractors 31a and 31, the sample hold circuits 32a and 32, the amplifiers 33a and 33, the sub-AD converter 34, and the sub-DA converter 35 form a closed loop.

Note that when a signal is input for the first time, the output of the sub-DA converter 35 is reset to zero.

A shift register 56 right-shifts the digital output signal of the sub-AD converter 34 by (DSBIT−1) in synchronization with an externally input clock signal (not shown). When DSBIT is three bits, the signal is right-shifted toward the LSB by two bits. Two digital accumulator circuits 57a and 57 that are connected together in series through a switch 44 and a switch 45 second-order integrates the digital output signal of the shift register 56.

The above operation, which is one cycle, is performed four times if DSBIT is three bits, to obtain the higher-order bits DSBIT.

<<0.5×-Gain Cyclic Conversion Mode>>

The switch 15 is connected to the input terminal 10, and the first-stage analog accumulator circuit 40a is not required. As the input signal to the input terminal 10 is zero, the second-stage sample hold circuit 32 holds a difference between the output of the amplifier 33 and the output of the sub-DA converter 35. The held signal is input through the switch 16 to an amplifier 43, which then amplifies the signal with a gain of 0.5. Note that the signal output from the amplifier 43 is fed back to the subtractor 31, which forms a 0.5×-gain analog accumulator circuit in the analog accumulator circuit 40.

The output signal of the amplifier 43 is input through the switches 17 and 18 to a sub-AD converter 39, which then performs 1.5-bit AD conversion. The sub-AD converter 39 outputs a ternary digital signal. The ternary signal is "+1," "0," or "−1."

The digital output signal of the sub-AD converter 39 is input to the sub-DA converter 35, which then performs 1.5-bit DA conversion. The output of the sub-DA converter 35 is connected to a 2×-gain amplifier 47 through a switch 48 and a switch 49, and is fed back to the subtractor 31.

The shift register 56 right-shifts the digital output signal of the sub-AD converter 39 by (DSBIT−2). The digital accumulator circuit 57 is set to a single stage by the switches 44 and 45, to digitally integrate the digital output signal of the shift register 56.

By the above operation, a conversion result that overlaps the two lowest-order bits of second-order delta-sigma conversion is obtained. Also, by obtaining such a 1.5-bit result, a conversion result that overlaps the highest-order bit of a 2×-gain cyclic conversion mode described next can be obtained.

<<2×-Gain Cyclic Conversion Mode>>

The switch 15 is currently connected to the input terminal 10. As the input signal is zero, the sample hold circuit 32 holds a difference between the output of the amplifier 33 and the output of the sub-DA converter 35. The held signal is input through the switch 16 to an amplifier 38, which then amplifies the signal with a gain of two. Note that the signal output from the amplifier 38 is fed back to the subtractor 31, which forms a 2×-gain analog accumulator circuit in the analog accumulator circuit 40.

The output signal of the amplifier 38 is input through the switches 17 and 18 to the sub-AD converter 39, which then performs 1.5-bit AD conversion. The sub-AD converter 39 outputs a ternary digital signal. The ternary signal is "+1," "0," or "−1."

The digital output signal of the sub-AD converter 39 is input to the sub-DA converter 35, which then performs 1.5-bit DA conversion. The switches 48 and 49 are connected to the 2×-gain amplifier 47.

The shift register 56 right-shifts the digital output signal of the sub-AD converter 39 by a value that is obtained by adding the current cycle count of the 2×-gain cyclic conversion mode to (DSBIT−2).

The digital accumulator circuit 57 is set to a single stage by the switches 44 and 45, to digitally integrate the digital output signal of the shift register 56.

In the 2×-gain cyclic conversion mode, the above operation, which is one cycle, is performed (CYBIT+1) times to obtain the lower-order bits CYBIT.

Note that the gain of the first conversion in the cyclic conversion mode is set so that the maximum residual voltage in second-order delta-sigma conversion does not exceed the conversion allowable voltage range of cyclic conversion, taking variations in each component into consideration. By maintaining such a relationship, the present technology is applicable to other schemes of second-order delta-sigma conversion, higher-order delta-sigma conversion, cascade delta-sigma conversion, etc.

Seventh Embodiment

Figure 13:
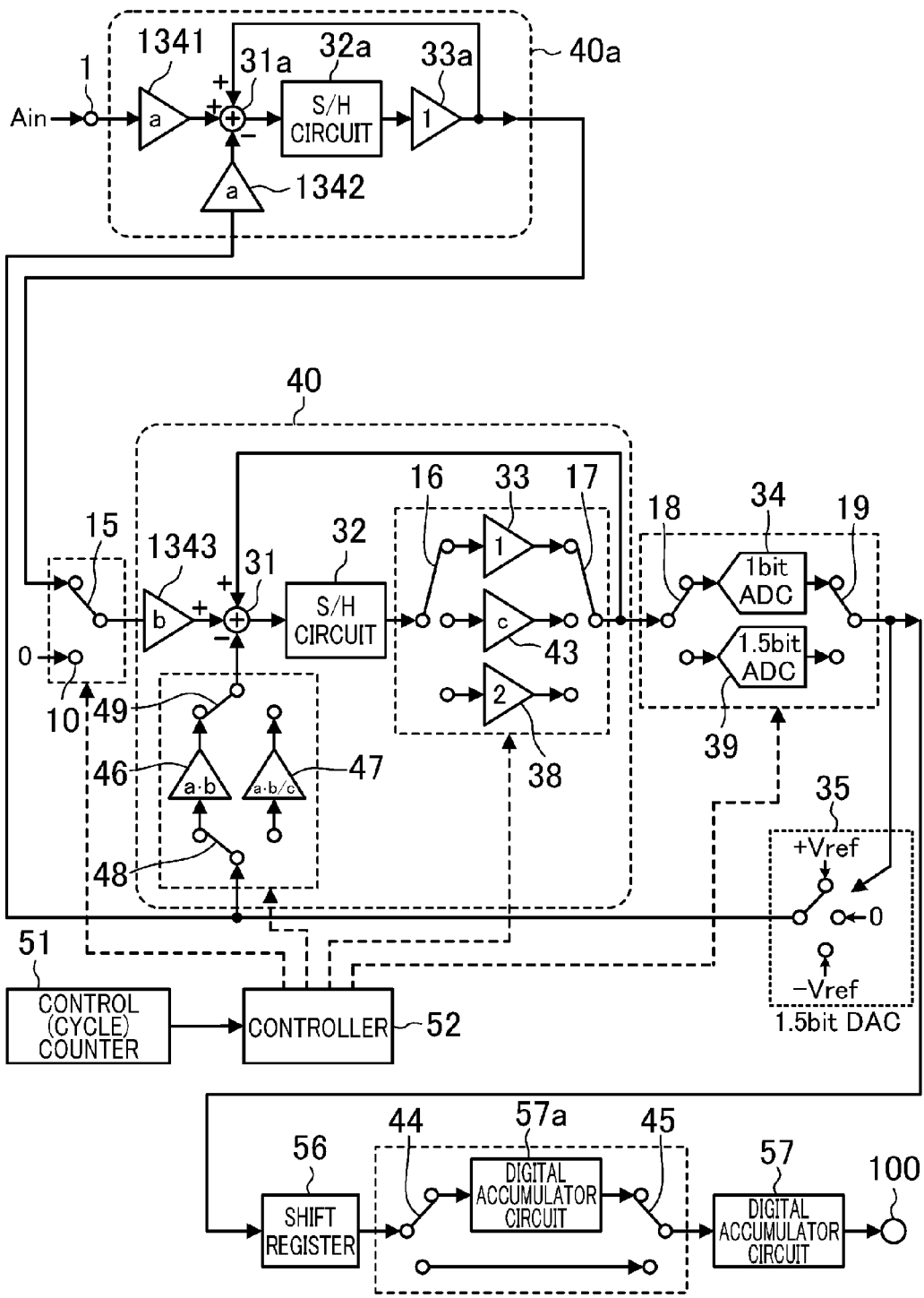
FIG. 13 is a diagram showing an AD converter according to a seventh embodiment of the present disclosure.

FIG. 13 is a diagram showing an AD converter according to a seventh embodiment of the present disclosure. The seventh embodiment is a practical example of the analog accumulator circuit included in the configuration of the sixth embodiment.

<<Second-Order Delta-Sigma Conversion Mode>>

In the first-stage analog accumulator circuit 40a, an amplifier 1341 with a gain of "a" is provided between the input terminal 1 of the analog input signal Ain and the subtractor 31a. An amplifier 1342 with a gain of "a" is provided between the 1.5-bit sub-AD converter 35 and the subtractor 31a.

In the second-stage analog accumulator circuit 40, an amplifier 1343 with a gain of "b" is provided between the switch 15 and the subtractor 31, and an amplifier 46 with a gain of a×b is provided between the 1.5-bit sub-AD converter 35 and the subtractor 31.

The amplifier gains "a" and "b" are set so that the maximum output values of the analog accumulator circuits 40a and 40 do not exceed the dynamic ranges of the circuits.

This can reduce or prevent a deterioration in characteristics due to saturation of the outputs of the analog accumulator circuits 40a and 40.

<<"c" ×-Gain Cyclic Conversion Mode>>

The switch 15 is connected to the input terminal 10. When the amplifier 43 has a gain of "c," the amplifier 47 provided between the 1.5-bit sub-DA converter 35 and the subtractor 31 is set to have a gain of a×b/c.

The above configuration provides a conversion result that overlaps the lowest-order bits of second-order delta-sigma conversion by $1+\log_2(1/c)$ bits.

<<2×-Gain Cyclic Conversion Mode>>

The switches 16 and 17 are connected to the amplifier 38, and the switches 48 and 49 are connected to the amplifier 47.

Note that the gain of the first conversion in the cyclic conversion mode is set so that the maximum residual voltage in second-order delta-sigma conversion does not exceed the conversion allowable voltage range of cyclic conversion, taking variations in each component into consideration. By maintaining such a relationship, the present technology is applicable to other schemes of second-order delta-sigma conversion, etc.

Eighth Embodiment

Figure 14:
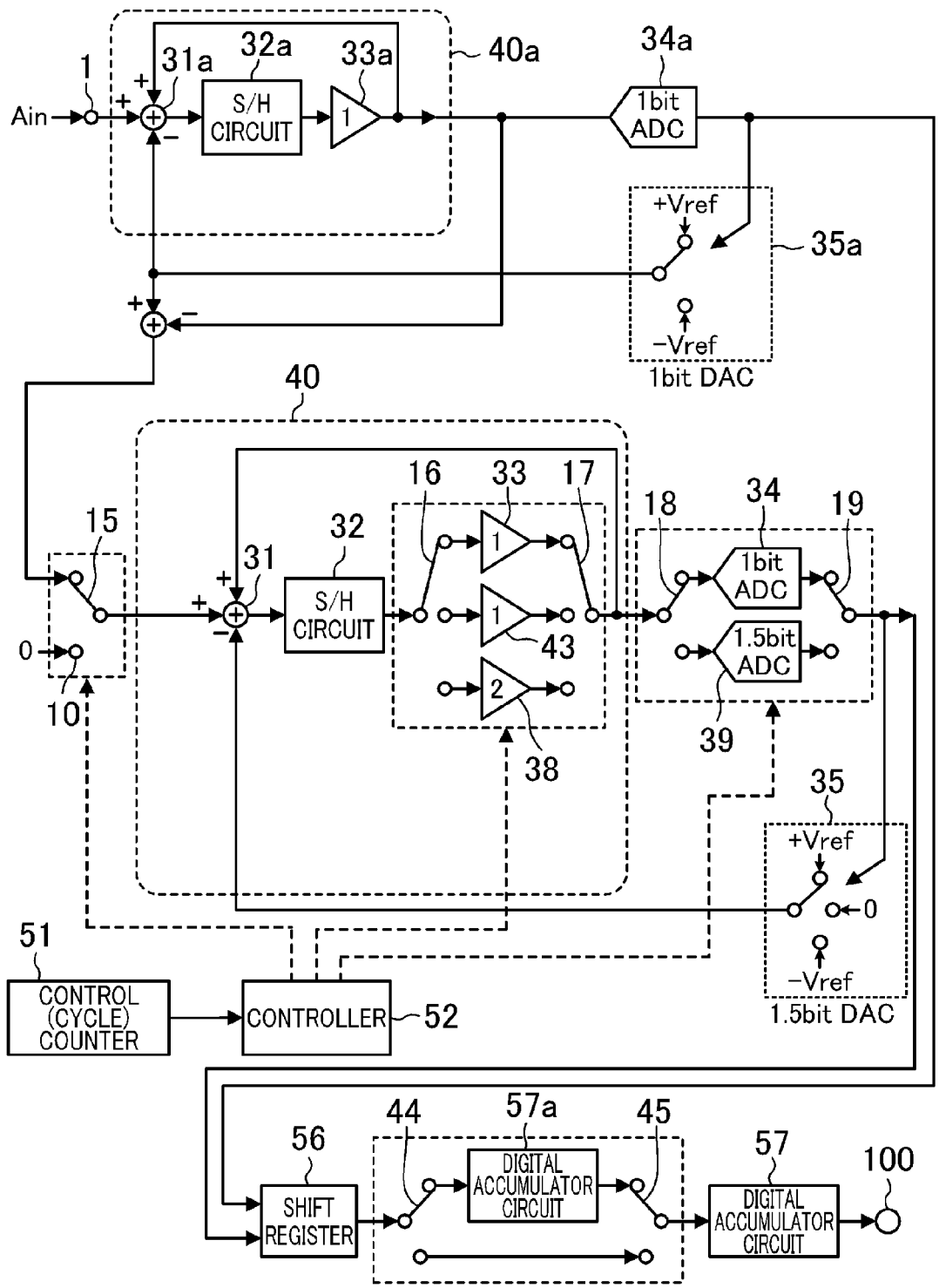
FIG. 14 is a diagram showing an AD converter according to an eighth embodiment of the present disclosure.

FIG. 14 is a diagram showing an AD converter according to an eighth embodiment of the present disclosure. Here, the first and second cyclic conversion modes will not be described, and only a second-order (1+1) cascade delta-sigma conversion mode will be described.

The output of a first-stage analog accumulator circuit 40a is input to a sub-AD converter 34a, which then performs 1-bit AD conversion. A digital output signal of the sub-AD converter 34a is input to a sub-DA converter 35a, which then performs 1-bit DA conversion. A difference voltage between the output of the first-stage analog accumulator circuit 40a and the output of the sub-DA converter 35a is input to a second-stage analog accumulator circuit 40 through a switch 15.

The second-stage analog accumulator circuit 40 also forms a closed loop, separately from the first-stage analog accumulator circuit 40a. The second-stage analog accumulator circuit 40 is switched between the amplifier 33 with a gain of one, the amplifier 43 with a gain of one, and the amplifier 38 with a gain of two.

A shift register 56 right-shifts the digital output signals of the sub-AD converters 34a and 34 by (DSBIT−1) in synchronization with an externally input clock signal (not shown). When DSBIT is three bits, the signal is right-shifted toward the LSB by two bits. The first-stage digital output signal is second-order integrated and the second-stage digital output signal is first-order integrated by two digital accumulator circuits 57a and 57 that are connected together in series through switches 44 and 45.

Note that the gain of the first conversion in the cyclic conversion mode is set so that the maximum residual voltage in second-order delta-sigma conversion does not exceed the conversion allowable voltage range of cyclic conversion, taking variations in each component into consideration. By maintaining such a relationship, the present technology is applicable to other schemes of cascade delta-sigma conversion, etc.

Ninth Embodiment

Figure 15:
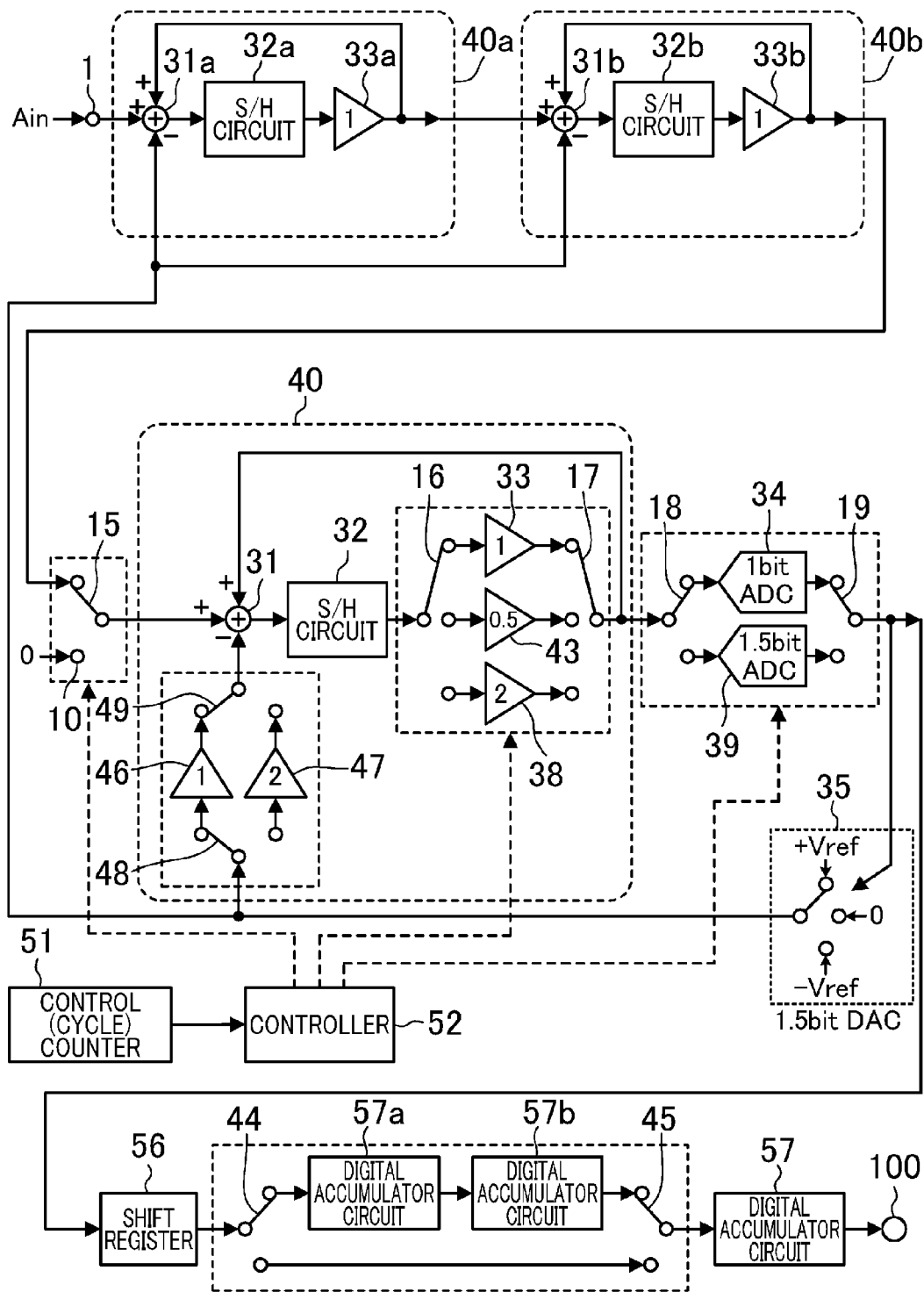
FIG. 15 is a circuit diagram showing an AD converter according to a ninth embodiment of the present disclosure.

FIG. 15 is a diagram showing an AD converter according to a ninth embodiment of the present disclosure. Here, the first and second cyclic conversion modes will not be described, and only a third-order delta-sigma conversion mode will be described.

The configuration of FIG. 15 is different from that of FIG. 12 of the sixth embodiment in that another analog accumulator circuit 40b is added between the first-stage analog accumulator circuit 40a and the second-stage analog accumulator circuit 40. A reference character 31b indicates a subtractor, a reference character 32b indicates a sample hold circuit, and a reference character 33b indicates an amplifier with a gain of one. A digital output signal of a shift register 56 is third-order integrated by three digital accumulator circuits 57a, 57b, and 57.

Note that the gain of the first conversion in the cyclic conversion mode is set so that the maximum residual voltage in third-order delta-sigma conversion does not exceed the conversion allowable voltage range of cyclic conversion, taking variations in each component into consideration. By maintaining such a relationship, the present technology is applicable to higher-order delta-sigma conversion, etc.

As described above, embodiments of the technology disclosed herein have been illustrated. To do so, the accompanying drawings and the detailed description have been provided.

The above embodiments are for the purpose of illustration of the technology of the present disclosure, and therefore, various changes, replacements, additions, deletions, etc., can be made thereto within the scope of the claims or equivalents thereof.

The AD converter of the present disclosure can improve linearity and thereby perform, for example, sensor signal detection at higher speed and with higher accuracy, without leading to an increase in circuit area, current consumption, and conversion time, compared to conventional techniques.

What is claimed is:

1. An AD converter comprising:
   a first AD converter including an analog accumulator circuit, an AD converter, and a DA converter, and configured to receive an analog signal and obtain a first conversion result having a higher-order bit or bits;
   a second AD converter including an analog accumulator circuit, an AD converter, and a DA converter, and configured to receive a residual signal resulting from removal of the higher-order bit or bits, and perform a first conversion process and a second conversion process to obtain a second conversion result having a lower-order bit or bit; and
   a calculation unit configured to calculate and output an AD conversion value of the analog signal based on the first and second conversion results,
   wherein
   the analog accumulator circuit in the first conversion process and the analog accumulator circuit in the second conversion process use different gains.

2. The AD converter of claim 1,
   wherein
   the first conversion process is an initial conversion process providing the residual signal, and the second conversion process is at least one additional conversion process performed after the initial conversion process.

3. The AD converter of claim 2,
   wherein
   the analog accumulator circuit uses a gain of one in the first conversion process, and the analog accumulator circuit uses a gain of two in the second conversion process.

4. The AD converter of claim 3,
   wherein
   the analog accumulator circuit included in the first AD converter is a first-order delta-sigma modulator.

5. The AD converter of claim 2,
   wherein
   the analog accumulator circuit uses a gain of $2^{-k}$ (k=0, 1, 2, . . . ) in the first conversion process, and the analog accumulator circuit uses a gain of two in the second conversion process.

6. The AD converter of claim 5,
   wherein
   the analog accumulator circuit included in the first AD converter is a higher-order delta-sigma modulator.

7. The AD converter of claim 6,
   wherein
   the analog accumulator circuit included in the first AD converter is a cascade delta-sigma modulator.

8. The AD converter of claim 1,
   wherein
   the analog accumulator circuit includes
      an operational amplifier having an input terminal and an output terminal, and configured to receive a signal through the input terminal and output a signal through the output terminal,
      a first capacitor connected between the input and output terminals of the operational amplifier,
      a second capacitor connected between the input and output terminals of the operational amplifier,
      a first switch circuit configured to select and connect a first terminal of the second capacitor and the input terminal of the operational amplifier or a fixed voltage terminal together, and
      a second switch circuit configured to select and connect a second terminal of the second capacitor and the output terminal of the operational amplifier or the fixed voltage terminal together.

9. The AD converter of claim 1, wherein
the analog accumulator circuit includes
an operational amplifier including a first input terminal, a second input terminal, and an output terminal, and configured to receive a signal through the first input terminal and a fixed voltage through the second input terminal, and output a signal through the output terminal,
a first capacitor, a second capacitor, and a first switch connected together in parallel between the first input terminal and the output terminal,
a second switch provided between a first terminal of the second capacitor and the first input terminal of the operational amplifier, and configured to electrically connect and disconnect the first terminal of the second capacitor and the first input terminal of the operational amplifier,
a third switch provided between the first terminal of the second capacitor and a fixed voltage terminal, and configured to electrically connect and disconnect the first terminal of the second capacitor and the fixed voltage terminal,
a fourth switch provided between a second terminal of the second capacitor and the output terminal of the operational amplifier, and configured to electrically connect and disconnect the second terminal of the second capacitor and the output terminal of the operational amplifier, and
a fifth switch provided between the second terminal of the second capacitor and the fixed voltage terminal, and configured to electrically connect and disconnect the second terminal of the second capacitor and the fixed voltage terminal.

10. The AD converter of claim 9, wherein
a signal is input between the first and second input terminals of the operational amplifier, and
the AD converter further includes
a third capacitor, a fourth capacitor, and a fifth switch connected together in parallel between the second input terminal and the output terminal,
a sixth switch provided between a first terminal of the fourth capacitor and the second input terminal of the operational amplifier, and configured to electrically connect and disconnect the first terminal of the fourth capacitor and the second input terminal of the operational amplifier,
a seventh switch provided between the second terminal of the fourth capacitor and a fixed voltage terminal, and configured to electrically connect and disconnect the second terminal of the fourth capacitor and the fixed voltage terminal,
an eighth switch provided between a second terminal of the fourth capacitor and the output terminal of the operational amplifier, and configured to electrically connect and disconnect the second terminal of the fourth capacitor and the output terminal of the operational amplifier, and
a ninth switch provided between the second terminal of the fourth capacitor and the fixed voltage terminal, and configured to electrically connect and disconnect the second terminal of the fourth capacitor and the fixed voltage terminal.

11. The AD converter of claim 1, wherein
the second AD converter is a cyclic AD converter.

12. The AD converter of claim 1, further comprising:
a digital circuit configured to receive output signals of the first and second AD converters, perform an accumulation process on each piece of output digital data, and output the processed data.

13. The AD converter of claim 4, wherein
output digital data of the first AD converter is digitally integrated using an equal weight, initial output digital data of the second AD converter is digitally integrated using a weight equal to the weight for the output digital data of the first AD converter, and thereafter, digital integration is performed using a weight, the weight being halved every digital integration.

14. The AD converter of claim 5, wherein
initial output digital data of the second AD converter is digitally integrated using a weight equal to 1/m of a smallest weight for output digital data of the first AD converter, where m represents a third gain of the analog accumulator circuit in the first conversion process, and thereafter, digital integration is performed using a weight, the weight being halved every digital integration.

15. The AD converter of claim 12, wherein
the digital circuit includes a shift register and a digital accumulator circuit.

* * * * *